(12) United States Patent
Irwin et al.

(10) Patent No.: US 12,084,580 B2
(45) Date of Patent: Sep. 10, 2024

(54) NICKEL OXIDE SOL-GEL INK

(71) Applicant: CubicPV Inc., Dallas, TX (US)

(72) Inventors: Michael Irwin, Heath, TX (US); Erin Sanehira, Dallas, TX (US)

(73) Assignee: CubicPV Inc., Bedford, MA (US)

( * ) Notice: Subject to any disclaimer, the term of this patent is extended or adjusted under 35 U.S.C. 154(b) by 0 days.

(21) Appl. No.: 18/331,261

(22) Filed: Jun. 8, 2023

(65) Prior Publication Data

US 2023/0312936 A1    Oct. 5, 2023

Related U.S. Application Data

(62) Division of application No. 17/136,503, filed on Dec. 29, 2020, now Pat. No. 11,713,396, which is a division of application No. 16/577,781, filed on Sep. 20, 2019, now Pat. No. 10,907,050.

(60) Provisional application No. 62/770,389, filed on Nov. 21, 2018.

(51) Int. Cl.
*C09D 1/00* (2006.01)
*B05D 3/02* (2006.01)
*C03C 17/25* (2006.01)

(52) U.S. Cl.
CPC ............. *C09D 1/00* (2013.01); *B05D 3/0254* (2013.01); *C03C 17/25* (2013.01); *C03C 2217/217* (2013.01); *C03C 2218/113* (2013.01); *C03C 2218/32* (2013.01)

(58) Field of Classification Search
CPC ........ C09D 1/00; B05D 3/0254; C03C 17/25; C03C 2217/217; C03C 2218/113; C03C 2218/32
See application file for complete search history.

(56) References Cited

U.S. PATENT DOCUMENTS

| 9,305,715 B2 | 4/2016 | Irwin et al. |
| 10,907,050 B2 | 2/2021 | Irwin et al. |
| 2002/0103087 A1 | 8/2002 | Stauf et al. |

(Continued)

FOREIGN PATENT DOCUMENTS

| CN | 101183687 A | 5/2008 |
| CN | 101326133 A | 12/2008 |

(Continued)

OTHER PUBLICATIONS

Request for providing information amending application in compliance with family patent, Vietnamese application No. 1-2021-03683 filed Nov. 14, 2019, mailed Aug. 28, 2023, 3 pages.

(Continued)

*Primary Examiner* — Robert S Walters, Jr.
(74) *Attorney, Agent, or Firm* — Baker Botts L.L.P.

(57) ABSTRACT

A method for forming a nickel oxide layer is disclosed herein. In some embodiments, a method includes depositing a nickel oxide precursor ink on a substrate, wherein the nickel oxide precursor ink comprises a solvent comprising diols, alcohol amines, and water, $Ni(NO_3)_2 \cdot 6H_2O$, and at least one metal acetate selected from the group consisting of $Ni(CH_3CO_2)_2 \cdot 4H_2O$ and $Cu(CH_3CO_2)_2 \cdot 1H_2O$, annealing the nickel oxide precursor ink at a temperature between 250° to 400° Celsius for between 10 minutes and 6 hours to form a nickel oxide layer, and cooling the nickel oxide layer.

6 Claims, 27 Drawing Sheets

(56) References Cited

U.S. PATENT DOCUMENTS

| | | |
|---|---|---|
| 2003/0170918 A1 | 9/2003 | DeHaven et al. |
| 2006/0137741 A1 | 6/2006 | Park et al. |
| 2008/0008895 A1 | 1/2008 | Garner et al. |
| 2008/0019901 A1 | 1/2008 | Shen et al. |
| 2008/0305153 A1 | 12/2008 | Wang et al. |
| 2009/0095341 A1 | 4/2009 | Pfenniger et al. |
| 2010/0218825 A1 | 9/2010 | Jee et al. |
| 2010/0282320 A1 | 11/2010 | Meyer et al. |
| 2010/0316331 A1 | 12/2010 | Kenney et al. |
| 2011/0027469 A1 | 2/2011 | Kirby et al. |
| 2012/0082782 A1 | 4/2012 | Wu et al. |
| 2013/0104969 A1 | 5/2013 | Rappe et al. |
| 2014/0332078 A1 | 11/2014 | Guo et al. |
| 2015/0136232 A1 | 5/2015 | Snaith et al. |
| 2015/0249170 A1 | 9/2015 | Snaith et al. |
| 2018/0026261 A1 | 1/2018 | Kim et al. |
| 2018/0237314 A1 | 8/2018 | Xing |

FOREIGN PATENT DOCUMENTS

| | | |
|---|---|---|
| CN | 102230172 A | 11/2011 |
| CN | 102646759 A | 8/2012 |
| CN | 103956431 A | 7/2014 |
| CN | 104091888 A | 10/2014 |
| CN | 104662625 A | 5/2015 |
| CN | 104693941 A | 6/2015 |
| CN | 105153808 A1 | 12/2015 |
| CN | 108682744 A1 | 10/2018 |
| CN | 108807687 A1 | 11/2018 |
| CN | 108996557 A1 | 12/2018 |
| EP | 3252839 A1 | 12/2017 |
| JP | H06115946 A1 | 4/1994 |
| JP | 2012-80066 A | 4/2012 |
| JP | 2014175473 A | 9/2014 |
| JP | 2015056430 A | 3/2015 |
| JP | 2015119102 A | 6/2015 |
| JP | 2016178167 A | 10/2016 |
| KR | 20150011002 A | 1/2015 |
| WO | 2013084029 A1 | 6/2013 |
| WO | 2013171517 | 11/2013 |
| WO | 2013171518 A1 | 11/2013 |
| WO | 2013171520 | 11/2013 |
| WO | 2014020499 A1 | 2/2014 |
| WO | 2014042449 A2 | 3/2014 |
| WO | 2014045021 A1 | 3/2014 |
| WO | 2014151522 A1 | 9/2014 |
| WO | 2014180780 A1 | 11/2014 |
| WO | 2016151535 A1 | 9/2016 |
| WO | 2018001372 A1 | 1/2018 |

OTHER PUBLICATIONS

Office action dated Jun. 26, 2023, mailed Jul. 4, 2023 from Japan Patent Office, Japanese Patent Application No. 2021-5288796, 6 pages.

Muecke Ulrich P, et al., Initial stages of deposition and film formation during spray pyrolysis—Nickel oxide, cerium gadolinium oxide and mixtures thereof, Thin Solid Films, Jan. 1, 2009, vol. 517 No. 5, p. 1522-1529.

Rejection Decision from China National Intellectual Property Administration, mailed Oct. 26, 2023, Chinese application No. 201980087256. 1, 9 pages.

Chen, S. C., et al. "Preparation and properties of p-type transparent conductive Cu-doped NiO films." Thin Solid Films 519.15 (2011): 4944-4947.

Bera, Ashok, et al. "Perovskite oxide SrTiO3 as an efficient electron transporter for hybrid perovskite solar cells." The Journal of Physical Chemistry C 118.49 (2014): 28494-28501.

Koh, Teck Ming, et al. "Formamidinium-containing metal-halide: an alternative material for near-IR absorption perovskite solar cells." The Journal of Physical Chemistry C 118.30 (2014): 16458-16462.

Mei, Anyi, et al. "A hole-conductor-free, fully printable mesoscopic perovskite solar cell with high stability." science 345.6194 (2014): 295-298.

Snaith, Henry J. "Perovskites: the emergence of a new era for low-cost, high-efficiency solar cells." The journal of physical chemistry letters 4.21 (2013): 3623-3630.

Ito, Seigo, et al. "Effects of surface blocking layer of Sb2S3 on nanocrystalline TiO2 for CH3NH3PbI3 perovskite solar cells." The Journal of Physical Chemistry C 118.30 (2014): 16995-17000.

Kim, Kyung Ho, et al. "Effects of Cu doping on nickel oxide thin film prepared by sol-gel solution process." Optik 125.12 (2014): 2899-2901.

Gabás, Mercedes, et al. "Differences in n-type doping efficiency between Al-and Ga—ZnO films." Journal of Applied Physics 113. 16 (2013): 163709.

Burschka, Julian, et al. "Sequential deposition as a route to high-performance perovskite-sensitized solar cells." Nature 499.7458 (2013): 316-319.

Jeng, Jun-Yuan, et al. "Nickel oxide electrode interlayer in CH3NH3PbI3 perovskite/PCBM planar-heterojunction hybrid solar cells." Advanced materials 26.24 (2014): 4107-4113.

Steirer, Kenneth Xerxes, et al. "Nickel oxide interlayer films from nickel formate-ethylenediamine precursor: influence of annealing on thin film properties and photovoltaic device performance." Journal of Materials Chemistry A 3.20 (2015): 10949-10958.

International Search Report and Written Opinion issued in related PCT Application No. PCT/US2019/061462 mailed Mar. 13, 2020, 11 pages.

Jung et al., "A Low-Temperature, Solution-Processable, Cu-Doped Nickel Oxide Hole-Transporting Layer via the Combustion Method for High-Performance Thin-Film Perovskite Solar Cells" Adv. Mater. 2015, 27, 7874-7880.

International Preliminary Report on Patentability and Written Opinion for International Application No. PCT/US2019/061462. Mailing Date: Jun. 3, 2021, 10 pages.

Extended European Search Report for European Patent Application No. 19888063.5 Mailing Date: Aug. 9, 2022, 10 pages.

Notification of the First Office Action, Chinese application No. 201980087256.1 mailed Feb. 3, 2023.

Communication pursuant to Article 94(3) EPC for European Patent Application No. 19888063.5, Mailing Date Jun. 26, 2023, 6 pages.

Modified Substantive Examination Adverse Report (Section 30(2)), MY Application No. PI2021002799, mailed Apr. 26, 2024, 2 pages.

Board Opinion from China National Intellectual Property Administration, mailed Jun. 6, 2024, Chinese application No. 201980087256. 1, 16 pages.

NICKEL OXIDE SOL-GEL INK

RELATED APPLICATIONS

This application is a divisional application of U.S. application Ser. No. 17/136,503, filed on Dec. 29, 2020, which is a divisional application of U.S. application Ser. No. 16/577,781, filed on Sep. 20, 2019, which claims priority from U.S. Provisional Patent Application No. 62/770,389, filed Nov. 21, 2018, the entire disclosures of which are incorporated by reference herein.

TECHNICAL FIELD

Particular embodiments relate generally to compositions for use in photovoltaic and optoelectronic devices, and more particularly to nickel oxide precursor ink compositions for use as thin film layers in photovoltaic, electronic, optoelectronic, and mechanical devices.

BACKGROUND

Photovoltaic (PV) and optoelectronic devices comprise multi-layer structures. Conventional precursor ink formulations for nickel oxide thin films among multiple layers in the PV devices have yielded incomplete surface coverage, poor surface morphology and undesirable optoelectronic properties. In perovskite photovoltaics, incomplete surface coverage can lead to increased non-radiative recombination and reduced open-circuit voltage. Poor surface morphology can negatively impact the perovskite film growth and quality.

Nickel oxide has been known to serve as a hole-transport and/or electron-blocking layer in PV and optoelectronic devices. Previous demonstrations of nickel oxide precursor inks often resulted in incomplete surface coverage, poor film morphology, and/or undesirable optoelectronic properties.

SUMMARY

To address the foregoing problems with existing solutions, disclosed is a nickel oxide (NiO) precursor ink.

According to some embodiments, a composition for use in a preparation of a nickel oxide layer includes nickel nitrate ($Ni(NO_3)_2 \cdot nH_2O$, wherein n is 0, 4, 6 or 9), at least one metal acetate; and a solvent combination comprising a diol, an alcohol amine, and water.

In particular embodiments, the at least one metal acetate is selected from the group of: nickel acetate tetrahydrate, copper acetate monohydrate, and combinations thereof.

In particular embodiments, the solvent combination comprises ethylene glycol, ethanolamine, and water.

In particular embodiments, the solvent combination comprises ethylene glycol, ethanolamine, water and acetylacetone.

In particular embodiments, the at least one metal acetate comprises nickel acetate tetrahydrate.

In particular embodiments, wherein the at least one metal acetate comprises copper acetate monohydrate.

In particular embodiments, the at least one metal acetate comprises nickel acetate tetrahydrate and copper acetate monohydrate.

According to some embodiments, a method for preparing a nickel oxide precursor ink includes: first, preparing a solvent comprising diols and alcohol amines. Next, adding nickel nitrate into the solvent to form a nickel nitrate containing solution. Next, adding at least one metal acetate into the nickel nitrate containing solution to form a nickel nitrate and metal acetate containing solution. Next, adding water to the nickel nitrate and metal acetate containing solution to form a nickel oxide precursor mixture. Next, heating the nickel oxide precursor mixture to 60 to 75 Celsius. Finally, cooling the nickel oxide precursor mixture to form the nickel oxide precursor ink.

In particular embodiments, the nickel nitrate is $Ni(NO_3)_2 \cdot nH_2O$ and n is 0, 4, 6 or 9.

In particular embodiments, the metal acetate is $Ni(CH_3CO_2)_2 \cdot xH_2O$, and x is 0, 2 or 4.

In particular embodiments, the nickel nitrate is $Ni(NO_3)_2 \cdot 6H_2O$ and the at least one metal acetate is $Ni(CH_3CO_2)_2 \cdot 4H_2O$.

In particular embodiments, the at least one metal acetate comprises $Ni(CH_3CO_2)_2 \cdot xH_2O$ and $Cu(CH_3CO_2)_2 \cdot bH_2O$, wherein x is 0, 2 or 4 and b is 0 or 1.

In particular embodiments, the nickel nitrate is $Ni(NO_3)_2 \cdot 6H_2O$ and the at least one metal acetate comprises $Ni(CH_3CO_2)_2 \cdot 4H_2O$ and $Cu(CH_3CO_2)_2 \cdot 1H_2O$.

In particular embodiments, the nickel oxide precursor mixture has a concentration of $Ni(NO_3)2 \cdot 6H_2O$ is between 0.7 M and 0.8 M and a concentration of $Ni(CH_3CO2) 2 \cdot 4H_2O$ is between 50 mM and 110 mM.

In particular embodiments, the concentration of $Ni(NO_3)_2 \cdot 6H_2O$ is 0.72 M and the concentration of $Ni(CH_3CO_2)_2 \cdot 4H_2O$ is 103 mM.

In particular embodiments, the nickel oxide precursor mixture has a concentration of $Ni(NO_3)_2 \cdot 6H_2O$ between 0.7 M and 0.8 M, a concentration of $Ni(CH_3CO_2)_2 \cdot 4H_2O$ between 50 mM and 110 mM, and a concentration of $Cu(CH_3CO_2)_2 \cdot 1H_2O$ between 20 mM and 41.3 mM.

In particular embodiments, the solvent comprises ethylene glycol and ethanolamine.

In particular embodiments, the solvent comprises ethylene glycol and ethanolamine; and the ethylene glycol, ethanolamine and water have a volume ratio of 12:1.46:1, respectively.

In particular embodiments, the method is performed under an inert atmosphere having less than 5 ppm water and less than 5 ppm oxygen.

According to some embodiments, a method for depositing a nickel oxide layer includes: first, preparing a substrate. Next, depositing a nickel oxide precursor ink onto the substrate. The nickel oxide precursor ink includes a solvent comprising diols, alcohol amines, and water, $Ni(NO_3)_2 \cdot 6H_2O$, and at least one metal acetate selected from the group consisting of $Ni(CH_3CO_2)_2 \cdot 4H_2O$ and $Cu(CH_3CO_2) 2 \cdot 1H_2O$. Next, annealing the nickel oxide precursor ink at a temperature between 250° to 400° Celsius for between 10 minutes and 6 hours. Finally, cooling the nickel oxide precursor ink to form the nickel oxide layer.

In particular embodiments, the method further includes filtering the nickel oxide precursor ink prior to depositing the nickel oxide precursor ink onto the substrate.

In particular embodiments, the solvent comprises ethylene glycol, ethanolamine and water.

In particular embodiments, the substrate is selected from the group consisting of glass, p-doped silicon, n-doped silicon, sapphire, magnesium oxide, mica, polymers, ceramics, fabrics, wood, drywall, metal, or combinations thereof, and any of the forgoing materials coated with materials selected from the group consisting of indium-doped tin oxide (ITO), fluorine-doped tin oxide (FTO), cadmium oxide (CdO), zinc indium tin oxide (ZITO), aluminum zinc oxide (AZO), aluminum (Al), gold (Au), calcium (Ca), magnesium (Mg), titanium (Ti), iron (Fe), chromium (Cr), copper (Cu), silver (Ag), nickel (Ni), tungsten (W), molybdenum (Mo), carbon allotropes, or combinations thereof.

In particular embodiments, the method is performed under an environment having a humidity between 10% and 50% and a temperature between 20° and 60° Celsius.

In particular embodiments, annealing takes place at a temperature of 310° Celsius for a time period of two hours.

According to certain embodiments, a composition for use in a preparation of a nickel oxide layer includes at least one metal nitrate, at least one metal acetate, and a solvent combination comprising a diol, an alcohol amine, and water.

In particular embodiments, the least one metal nitrate comprises copper nitrate, the at least one metal acetate comprises nickel acetate; the solvent comprises ethylene glycol, ethanolamine, and water.

In particular embodiments, wherein the least one metal nitrate comprises nickel nitrate, the at least one metal acetate comprises copper acetate, and the solvent comprises ethylene glycol, ethanolamine, and water.

In particular embodiments, wherein the least one metal nitrate comprises nickel nitrate, the at least one metal acetate comprises nickel acetate, and the solvent comprises ethylene glycol, ethanolamine, and water.

In particular embodiments, wherein: the least one metal nitrate comprises nickel nitrate, the at least one metal acetate comprises nickel acetate and copper acetate, and the solvent comprises ethylene glycol, ethanolamine, and water.

Nickel oxide precursor inks disclosed herein may be deposited via solution-based inks or physical deposition methods, such as spin coating, blade coating, and slot-die coating. Nickel oxide precursor inks disclosed herein also provide tunability through the ink formulation and additive engineering. Solution-based nickel oxide precursor inks disclosed herein enable high-throughput, low-cost deposition techniques. In addition, increasing the transparency of the layer/film prepared from nickel oxide precursor inks disclosed herein can reduce parasitic absorption and increase the short-circuit current. Alternatively, increasing the absorption of higher energy photons may be used as filtering for UV-induced degradation. The formulation of nickel oxide precursor inks disclosed herein provides the optionality for different applications.

The features and advantages of the present disclosure will be readily apparent to those skilled in the art. While numerous changes may be made by those skilled in the art, such changes are within the spirit of the invention.

DETAILED DESCRIPTION OF PREFERRED EMBODIMENTS

Figure 1:
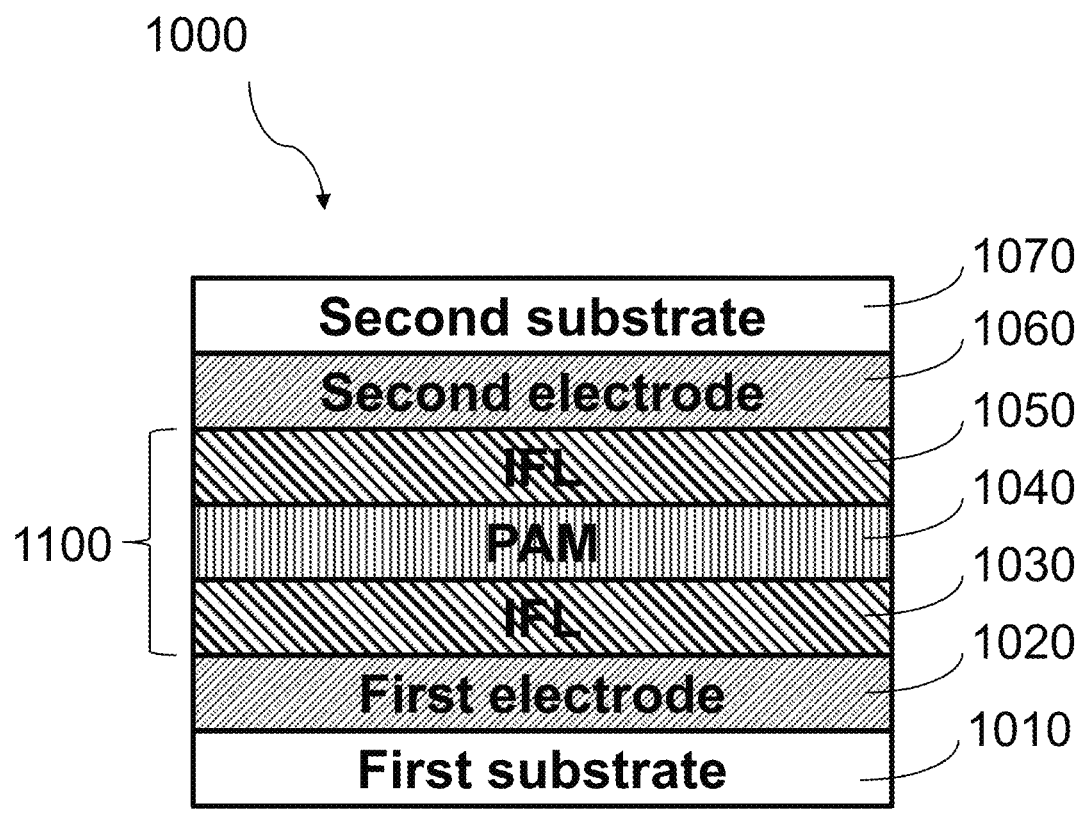
FIG. 1 is an example diagram illustrating components of an exemplar PV device according to some embodiments of the present disclosure.

The present disclosure relates generally to materials to form a thin film layer, methods of preparing and applying the materials to thin film layer, and apparatus of use of thin film layer in optical devices, electronic devices, mechanical devices, and photovoltaic cells in increasing short-circuit current and open-circuit voltage, and reducing parasitic absorption. More specifically, this disclosure relates to formation of nickel oxide (NiO) precursor ink compositions, as well as apparatus, methods of use, and preparation of such compositions of matter.

The NiO precursor ink of the present disclosure includes a nickel nitrate and/or nickel acetate and may include a metal nitrate or metal acetate dissolved in a solvent mixture comprising a diol, water, and an alcohol-amine. In some embodiments the NiO precursor ink includes nickel nitrate an one or more metal acetates dissolved in a solvent mixture comprising a diol, water, and an alcohol. In other embodiments, the NiO precursor ink includes nickel acetate and one or more metal nitrates, and does not include nickel nitrate, dissolved in a solvent mixture comprising a diol, water, and an alcohol-amine. After the NiO precursor ink layer has been deposited on a substrate, the layers and/or films may be heated and annealed, resulting in a combustion reaction that yields a nickel oxide thin layer/film which is formed by the NiO precursor ink disclosed in the present disclosure. The yielded nickel oxide thin layer/film may serve as an effective hole-transport layer in photovoltaic devices.

In some embodiments, the NiO precursor ink of the present disclosure may include other metals as described herein. These metals may act as dopants in the resulting nickel oxide thin film, resulting in hole-transporting or electron-transporting nickel oxide thin films, depending on the metal dopant(s) included in the NiO precursor ink.

Examples of compounds to prepare the NiO precursor ink may include, but are not limited to, anhydrous nickel nitrate, nickel nitrate hexahydrate, nickel nitrate nonahydrate, nickel nitrate tetrahydrate, nickel nitrate dihydrate, and any derivative hydrates of nickel nitrate, and anhydrous nickel acetate, nickel acetate dihydrate, nickel acetate tetrahydrate, and anhydrous copper nitrate, copper nitrate monohydrate, copper nitrate sesquihydrate, copper nitrate hemipentahydrate, copper nitrate trihydrate, copper nitrate hexahydrate, and any derivative hydrates of copper nitrate, and anhydrous copper acetate, copper acetate monohydrate.

The NiO precursor inks of the present disclosure may be formulated using a mixture of nickel nitrate ($Ni(NO_3)_2$), a metal acetate, and water in a diol solvent with an alcohol-amine additive. In certain embodiments, the metal acetate may be one or more of nickel acetate ($Ni(CH_3CO_2)_2$) or copper acetate ($Cu(CH_3CO_2)_2$), and amines, diamines, and acetylacetone (and derivatives thereof) may also be included in the NiO precursor ink. Compositions and methods for forming embodiments of the NiO precursor ink are described further herein. After the NiO precursor ink is formulated, it may be deposited and annealed to form a NiO thin film. The resulting NiO thin film may be a p-type semiconductor. In some embodiments, the NiO precursor ink may be applied to form an NiO thin film in a variety of electronic devices, including but not limited to photovoltaics (PV), field effect transistors (FETs), light emitting diodes (LEDs), charge coupled devices (CCDs), photodiodes, x-ray detectors, and complementary metal-oxide-semiconductors (CMOS).

In some embodiments, a nickel oxide precursor ink may be formulated with a mixture of nickel nitrate, nickel acetate, water, and ethanol amine in an ethylene glycol solvent. In other embodiments, a nickel oxide precursor ink may be formulated with a mixture of nickel nitrate, nickel acetate, water, ethanol amine, and acetylacetone in an ethylene glycol solvent. In yet other embodiments, a nickel oxide precursor ink may be formulated with a mixture of nickel nitrate, copper acetate, water, and ethanol amine in an ethylene glycol solvent. In yet other embodiments, a nickel oxide precursor ink may be formulated with a mixture of nickel nitrate, copper acetate, water, ethanol amine, and acetylacetone in an ethylene glycol solvent. In other embodiments, a nickel oxide precursor ink may be formulated with a mixture of nickel nitrate, a metal acetate having the formula $M(CH_3CO_2)_y$ wherein M may be any metal (for example, Cu, Li, Na, K, Rb, Cs, Be, Mg, Ca, Sr, Ba, Sc, Y, Ti, Zr, Hf, V, Nb, Ta, Cr, Mo, W, Mn, Re, Fe, Ru, Os, Co, Rh, Ir, Pd, Pt, Cu, Ag, Au, Zn, Cd, Hg, B, Al, Ga, In, Tl, Si, Ge, Sn, Pb, As, Sb, Bi, Se, Te, La, Ce, Pr, Nd, Sm, Er, Gd, Tb, Dy, Ho, Er, Ym, Yb, Lu, Ac, Th, Pa, and U) and y corresponds to the oxidation state of the metal M (e.g., y=2 where M is $Cu^{2+}$ and y=6 where M is $W^{6+}$), water, and ethanol amine in an ethylene glycol solvent.

In some embodiments, hydrates of nickel nitrate (e.g., $Ni(NO_3)_2 \cdot aH_2O$), nickel acetate (e.g., $Ni(CH_3CO_2)_2 \cdot bH_2O$), copper acetate (e.g., $Cu(CH_3CO_2)_2 \cdot cH_2O$), or metal acetate (e.g., $M(CH_3CO_2)_y \cdot dH_2O$) may be included in the nickel oxide precursor ink formulation as described herein, where a, b, c, and d in the forgoing formulas correspond to a number of $H_2O$ molecules in the hydrate.

In some embodiments, compounds for preparing the NiO precursor inks may include nickel nitrate hexahydrate ($Ni(NO_3)_2 \cdot 6H_2O$), nickel acetate tetrahydrate ($Ni(CH_3CO_2)_2 \cdot 4H_2O$), copper nitrate trihydrate ($Cu(NO_3)_2 \cdot 3H_2O$), and copper acetate monohydrate ($Cu(CH_3CO_2)_2 \cdot H_2O$).

Examples of solvents for preparing the NiO precursor ink may include, but are not limited to, one or more of glycerol; ethylene glycol; propylene glycol; methanol; ethanol; and any other compounds comprising at least one hydroxyl groups, such as alcohols and diols; ammonia; acetone; acetylacetone, and any compounds comprising at least one carbonyl group; ethylamine, and any other aryl and alkylamines; ethanolamine, and any amines comprising at least one hydroxyl group; water; di- and polyamines, and any other solvent suitable to dissolve the compounds for preparing the NiO precursor ink.

In certain embodiments, a solvent for preparing the NiO precursor inks may comprise ethylene glycol, ethanolamine and water. In one particular embodiment, the solvent may comprise ethylene glycol, ethanolamine and water in a ratio of 12:1.46:1 by volume.

In a particular embodiment, the NiO precursor ink consists of $Ni(NO_3)_2$ and $Ni(CH_3CO_2)_2$ dissolved in a solvent mixture consisting of a diol, an alcohol amine, and water.

In another embodiment, the NiO precursor ink consists of $Ni(NO_3)_2$ and a metal acetate ($M(CH_3CO_2)_y$) dissolved in a solvent mixture consisting of a diol, an alcohol amine, and water.

In another embodiment, the NiO precursor ink consists of $Ni(NO_3)_2$, $Ni(CH_3CO_2)_2$ and a metal acetate ($M(CH_3CO_2)_y$) dissolved in a solvent mixture consisting of a diol, an alcohol amine, and water.

In another embodiment, the NiO precursor ink consists of $Ni(NO_3)_2$, $Ni(CH_3CO_2)_2$ and a metal nitrate ($M(NO_3)_y$) dissolved in a solvent mixture consisting of a diol, an alcohol amine, and water.

In another embodiment, the NiO precursor ink consists of $Ni(CH_3CO_2)_2$, and a metal nitrate ($M(NO_3)_y$) dissolved in a solvent mixture consisting of a diol, an alcohol amine, and water.

An example preparation of the NiO precursor ink may comprise 0.7-0.8 M nickel nitrate hexahydrate and 50-110 mM nickel acetate tetrahydrate in a solvent which comprises ethylene glycol, ethanolamine and water in a volume ratio of 5-20 to 1-5 to 1-5, respectively. In a particular embodiment, the preparation of the NiO precursor ink may comprise 0.72 M nickel nitrate hexahydrate and 103 mM nickel acetate tetrahydrate in a solvent which comprises ethylene glycol, ethanolamine and water in a volume ratio of 12:1.46:1. In some embodiments, the NiO precursor ink may additionally include 0-20 mol % copper and 0-50 mol % acetate.

Another example preparation of the NiO precursor ink may comprise 0.7-0.8 M nickel nitrate and 50-110 mM metal acetate in a solvent which comprises ethylene glycol, ethanolamine and water in a volume ratio of 5-20 to 1-5 to 1-5, respectively. In a particular embodiment, the preparation of the NiO precursor ink may comprise 0.72 M nickel nitrate hexahydrate and 103 mM metal acetate in a solvent which comprises ethylene glycol, ethanolamine and water in a volume ratio of 12:1.46:1. In some embodiments, the NiO precursor ink may additionally include 0-20 mol % copper and 0-50 mol % acetate.

Another example preparation of the NiO precursor ink may comprise 0.7-0.8 M nickel nitrate hexahydrate, 50-110 mM nickel acetate tetrahydrate, and 20-41.3 mM metal nitrate in a solvent which comprises ethylene glycol, ethanolamine and water in a volume ratio of 5-20 to 1-5 to 1-5, respectively. In a particular embodiment, the metal nitrate may be copper nitrate trihydrate. In a particular embodiment, the preparation of the NiO precursor ink may comprise 0.72 M nickel nitrate hexahydrate, 103 mM nickel acetate tetrahydrate, and 30 mM metal nitrate in a solvent which comprises ethylene glycol, ethanolamine and water in a volume ratio of 12:1.46:1.

Another example preparation of the NiO precursor ink may comprise 0.7-0.8 M nickel nitrate hexahydrate, 50-110 mM nickel acetate tetrahydrate, and 20-41.3 mM metal acetate in a solvent which comprises ethylene glycol, ethanolamine and water in a volume ratio of 5-20 to 1-5 to 1-5, respectively. In some embodiments, the metal nitrate may be copper acetate. In a particular embodiment, the preparation of the NiO precursor ink may comprise 0.72 M nickel nitrate hexahydrate, 103 mM nickel acetate tetrahydrate, and 30 mM metal acetate in a solvent which comprises ethylene glycol, ethanolamine and water in a volume ratio of 12:1.46:1.

Another example preparation of the NiO precursor ink may comprise 0.7-0.8 M metal nitrate and 50-110 mM nickel acetate tetrahydrate in a solvent which comprises ethylene glycol, ethanolamine and water in a volume ratio of 5-20 to 1-5 to 1-5, respectively. In a particular embodiment, the preparation of the NiO precursor ink may comprise 0.72 M metal nitrate and 103 mM nickel acetate tetrahydrate in a solvent which comprises ethylene glycol, ethanolamine and water in a volume ratio of 12:1.46:1.

An example method for preparing the NiO may include, but is not limited to, the following steps. First, a solvent is prepared comprising diols and amines which comprise at least one hydroxyl group (an "alcohol-amine"). For example, the solvent may be prepared by mixing ethanolamine into ethylene glycol. Next, $Ni(NO_3)_2 \cdot aH_2O$ is added to the solvent, where a may be 0, 4, 6 or 9. In particular embodiments, the nickel nitrate may be nickel nitrate hexahydrate (a=6). Next, $Ni(CH_3CO_2)_2 \cdot bH_2O$ is added to the mixture, where b may be 0, 2, or 4. The nickel acetate may be nickel acetate tetrahydrate, in particular embodiments. Next, water is added to the mixture. Next, the mixture is heated. Finally, the mixture is cooled to form the NiO precursor ink. In certain embodiments, when each component is added to the mixture, the mixture may be mixed by vibrating, agitating, stirring, homogenizing, combining turbulent flows, vortex mixing, or any other known method of mixing. In certain embodiments, the NiO layer may be prepared in either an inert atmosphere or an atmosphere having a high humidity (e.g. greater than 4 grams $H_2O$ per liter of the atmosphere).

In some embodiments, water may be added before the cooling step, so that the final concentration of nickel nitrate hexahydrate is 0.7-0.8 M and the final concentration of nickel acetate tetrahydrate is 50-110 mM.

The NiO precursor ink may be deposited onto a variety of substrates to form a thin film NiO layer for use in optical, mechanical, and electronic applications, including but not limited to photovoltaics (PV), field effect transistors (FETs), light emitting diodes (LEDs), charge coupled devices (CCDs), photodiodes, x-ray detectors, and complementary metal-oxide-semiconductors (CMOS). In some embodiments, the layer formed by the NiO precursor ink may be used in photovoltaic cells. In particular embodiments, the layer formed by the NiO precursor ink may be used as hole-transport and/or electron-transport layers. In certain embodiments, the NiO precursor ink maybe deposited as a thin-film IFL. In particular embodiments, the NiO precursor ink may be deposited to form a thin film NiO layer in a photovoltaic device with a perovskite photoactive layer.

Suitable substrate materials include any one or more of: glass; quartz, p-doped silicon substrate; n-doped silicon substrate; sapphire; magnesium oxide (MgO); mica; polymers (e.g., PET, PEG, PES, polypropylene, polyethylene, etc.); ceramics; fabrics (e.g., cotton, silk, wool); wood; drywall; metal; and combinations thereof. In some embodiments, the substrate onto which the NiO precursor ink may be deposited may be coated with an electrode. The electrode may be either an anode or a cathode. Suitable materials for the electrode may include indium-doped tin oxide (ITO); fluorine-doped tin oxide (FTO); cadmium oxide (CdO); zinc indium tin oxide (ZITO); aluminum zinc oxide (AZO); aluminum (Al); gold (Au); calcium (Ca); magnesium (Mg); titanium (Ti); iron (Fe); chromium (Cr); copper (Cu); silver (Ag); nickel (Ni); tungsten (W); molybdenum (Mo); carbon (and allotropes thereof); and combinations thereof, and any other materials which may function as an electrode. For example, the substrate with electrode coating may include ITO-coated glass, FTO-coated glass, Ag-coated glass, CdO-coated glass, and ITO-coated PET.

In some embodiments the substrate may be additionally coated with one or more interfacial layers (IFL) as described herein. In some embodiments, the IFL may be alumina ($Al_2O_3$). In some embodiments, the IFL may form a contiguous layer. In other embodiments, the IFL may form a non-contiguous layer.

An example method for depositing the NiO precursor ink may include, but is not limited to, preparing a substrate, depositing the NiO precursor ink onto the substrate, annealing the NiO precursor ink and cooling the NiO precursor ink to form a thin film NiO layer. Depositing the NiO precursor ink onto the substrate may include depositing the NiO precursor ink onto any preceding layers deposited onto the substrate. For example, an electrode layer may be deposited onto the substrate prior to deposition of the NiO precursor ink, which may then be deposited onto the electrode layer. Likewise, in some embodiments, an electrode layer and one or more interfacial layers may be deposited onto the substrate prior to deposition of the NiO precursor ink.

In some embodiments, depositing the NiO precursor ink may be performed by spin coating, blade coating, slot-die coating, screen printing, roll-to-roll coating, spray coating, dip coating, or gravure printing. In some embodiments, the NiO precursor ink may be deposited onto the substrate in an environment having a relative humidity between 10 and 50% and a temperature between 20° and 60° Celsius. In a particular embodiment, the NiO precursor ink may be deposited onto the substrate in an environment having a relative humidity of 35% and a temperature of 35° Celsius. In some embodiments, the NiO precursor ink may be filtered before being deposited onto the substrate. In particular embodiments, filtering the NiO precursor ink may include dispensing the NiO precursor ink through 0.2 µm filter. In some embodiments, annealing may take place at a temperature between 250° Celsius and 400° Celsius for a time period between 30 minutes and 6 hours. In a particular embodiment, annealing may take place at a temperature of 310° Celsius for a time period of two hours. In some embodiments, the step of annealing the IFL on the substrate may include increasing the temperature from 35° to 310° Celsius at a rate of approximately 50° Celsius per five minutes. Cooling the NiO thin film layer formed after annealing the NiO precursor ink may include cooling it to near-room temperature (20°-50° Celsius) by allowing the substrate and thin film layers to rest in a near-room temperature environment. In some embodiments, the NiO thin film layer may annealed one or more times after the first annealing step, in the same manner as described above. For example, a substrate with an NiO thin film layer deposited as disclosed herein may be stored and reannealed prior to subsequent processing steps.

In a particular embodiment, the method for depositing the NiO precursor ink may include preparing a substrate, depositing an alumina thin film layer, depositing the NiO precursor ink onto the alumina thin film, annealing the NiO precursor ink to form a NiO thin film, depositing a perovskite material, depositing an interfacial layer, and depositing an electrode. In some embodiments, depositing the NiO precursor ink may follow a pattern which starts at one side of the substrate and covers the substrate row by row continuously to ensure a good coverage of NiO precursor ink on the substrate without dripping.

FIG. 1 illustrates a stylized diagram of a perovskite material device 1000 according to some embodiments. Although various components of the device 1000 are illustrated as discrete layers comprising contiguous material, it should be understood that FIG. 1 is a stylized diagram; thus, embodiments in accordance with it may include such discrete layers, and/or substantially intermixed, non-contiguous layers, consistent with the usage of "layers" previously discussed herein. The device 1000 includes first and second substrates 1010 and 1070. A first electrode 1020 is disposed upon an inner surface of the first substrate 1010, and a second electrode 1060 is disposed on an inner surface of the second substrate 1070. An active layer 1100 is sandwiched between the two electrodes 1020 and 1060. The active layer 1100 includes an interfacial layer (IFL) 1030; photoactive material (PAM) layer 1040; and an IFL 1050.

A perovskite material device according to some embodiments may optionally include one or more substrates. In some embodiments, either or both of the first and second electrodes 1020 and 1060 may be coated or otherwise disposed upon a substrate, such that the electrode is disposed substantially between a substrate and the active layer. The materials of composition of devices (e.g., substrate, electrode, active layer and/or active layer components) may in whole or in part be either rigid or flexible in various embodiments. In some embodiments, an electrode may act as a substrate, thereby negating the need for a separate substrate.

A substrate, such as either or both of first and second substrates 1010 and 1070, may be flexible or rigid. If two substrates are included, at least one should be transparent or translucent to electromagnetic (EM) radiation (such as, e.g., UV, visible, or IR radiation). If one substrate is included, it may be similarly transparent or translucent, although it need not be, so long as a portion of the device permits EM radiation to contact the active layer 1100.

As previously noted, an electrode (e.g., one of electrodes 1020 and 1060 of FIG. 1) may be either an anode or a cathode. In some embodiments, one electrode may function as a cathode, and the other may function as an anode. Either or both electrodes 1020 and 1060 may be coupled to leads, cables, wires, or other means enabling charge transport to and/or from the device 1000. An electrode may constitute any conductive material, and at least one electrode should be transparent or translucent to EM radiation, and/or be arranged in a manner that allows EM radiation to contact at least a portion of the active layer 1100.

The example NiO precursor inks described herein may be deposited by any of the methods described herein to form a NiO thin film layer as an interfacial layer (IFL) or in addition to other IFLs as described below. An interfacial layer may include any suitable material for enhancing charge transport and/or collection between adjacent layers or materials; it may also help prevent or reduce the likelihood of charge recombination once a charge has been transported away from one of the materials adjacent to the interfacial layer. An interfacial layer may additionally physically and electrically homogenize its substrates to create or reduce variations in substrate roughness, dielectric constant, adhesion, creation or quenching of defects (e.g., charge traps, surface states). Suitable interfacial materials may include any one or more of: Ag; Al; Au; B; Bi; Ca; Cd; Ce; Co; Cr; Cu; Fe; Ga; Ge; H; In; Mg; Mn; Mo; Nb; Ni; Pt; Sb; Sc; Si; Sn; Ta; Ti; V; W; Y; Zn; Zr; carbides of any of the foregoing metals (e.g., SiC, $Fe_3C$, WC, VC, MoC, NbC); silicides of any of the foregoing metals (e.g., $Mg_2Si$, $SrSi_2$, $Sn_2Si$); oxides of any of the foregoing metals (e.g., alumina, silica, titania, $SnO_2$, ZnO, $WO_3$, $V_2O_5$, $MoO_3$, NiO, $ZrO_2$, $HfO_2$), include transparent conducting oxides ("TCOs") such as indium tin oxide, aluminum doped zinc oxide (AZO), cadmium oxide (CdO), and fluorine doped tin oxide (FTO); sulfides of any of the foregoing metals (e.g., CdS, $MoS_2$, $SnS_2$); nitrides of any of the foregoing metals (e.g., GaN, $Mg_3N_2$, TiN, BN, $Si_3N_4$); selenides of any of the foregoing metals (e.g., CdSe, $FeS_2$, ZnSe); tellurides of any of the foregoing metals (e.g., CdTe, $TiTe_2$, ZnTe); phosphides of any of the foregoing metals (e.g., InP, GaP, GaInP); arsenides of any of the foregoing metals (e.g., $CoAs_3$, GaAs, InGaAs, NiAs); antimonides of any of the foregoing metals (e.g., AlSb, GaSb, InSb); halides of any of the foregoing metals (e.g., CuCl, CuI, $BiI_3$); pseudohalides of any of the foregoing metals (e.g., CuSCN, AuCN, $Fe(SCN)_2$); carbonates of any of the foregoing metals (e.g., $CaCO_3$, $Ce_2(CO_3)_3$); functionalized or non-functionalized alkyl silyl groups; graphite; graphene; fullerenes; carbon nanotubes; any mesoporous material and/or interfacial material discussed elsewhere herein; and combinations thereof (including, in some embodiments, bilayers, trilayers, or multi-layers of combined materials). In some embodiments, an interfacial layer may include perovskite material. Further, interfacial layers may comprise doped embodiments of any interfacial material mentioned herein (e.g., Y-doped ZnO, N-doped single-wall carbon nanotubes). Interfacial layers may also comprise a compound having three of the above materials (e.g., $CuTiO_3$, $Zn_2SnO_4$) or a compound having four of the above materials (e.g., CoNiZnO). The materials listed above may be present in a planar, mesoporous or otherwise nano-structured form (e.g. rods, spheres, flowers, pyramids), or aerogel structure.

In certain embodiments, an alumina IFL layer as described herein may be deposited according to the following method. First an alumina precursor solution may be prepared. The alumina precursor solution may be prepared by dissolving aluminum nitrate in a mixture of butanol, chloroform, and methanol. In some embodiments the butanol, chloroform, and methanol solution may have a ratio of 1:1:1 by volume of butanol, chloroform, and methanol. In certain embodiments, aluminum nitrate may be dissolved in with butanol, chloroform, and methanol to form a solution having a concentration of 25 mM of aluminum nitrate.

Next, the alumina precursor solution may be deposited onto a substrate. Depositing the alumina precursor solution onto the substrate may include depositing the alumina precursor solution precursor ink onto any preceding layers deposited onto the substrate. In some embodiments, the alumina precursor solution may be deposited by spin coating, slot die coating, or blade coating, amongst others described herein. In particular embodiments, the alumina precursor solution may be deposited so as to result in a layer 1 nm to 100 nm in thickness. In another embodiment, the alumina precursor solution may be deposited at a thickness of less than 1 nm. In some embodiments, the alumina precursor solution may be deposited in a continuous manner over the entire area of the substrate. In other embodiments, the alumina precursor solution may be deposited in a discontinuous manner such that the alumina precursor solution covers portions of the area of the substrate. After deposition, the alumina precursor may be annealed. To anneal the alumina precursor, the temperature of the substrate may be increased to 310° Celsius over a 25-minute interval, and then held at 310° Celsius for 35 minutes. Annealing the alumina precursor may occur in a controlled humidity environment. In some embodiments, the controlled humidity environment may be controlled to maintain a humidity of 25% relative humidity during deposition and annealing of the alumina oxide precursor. After annealing, the substrate may be allowed to cool to room temperature in ambient conditions. After annealing and cooling, the alumina precursor to form an alumina layer, subsequent layers may be deposited onto the alumina layer, such as an NiO layer by the methods described herein. The alumina layer may be continuous or discontinuous over the surface of the substrate.

Although referred to herein as NiO and/or nickel oxide, it should be noted that various ratios of nickel and oxygen may be used in forming nickel oxide. Thus, although some embodiments discussed herein are described with reference to NiO, such description is not intended to define a required ratio of nickel in oxygen. Rather, embodiments may include any one or more nickel-oxide compounds, each having an nickel oxide ratio according to $Ni_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $Ni_xO_y$ may be present in various embodiments, such as alpha, gamma, and/or amorphous forms.

Furthermore, although referred to herein as $Al_2O_3$ and/or alumina, it should be noted that various ratios of aluminum and oxygen may be used in forming alumina. Thus, although some embodiments discussed herein are described with reference to $Al_2O_3$, such description is not intended to define a required ratio of aluminum in oxygen. Rather, embodiments may include any one or more aluminum-oxide compounds, each having an aluminum oxide ratio according to $Al_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $Al_xO_y$ may be present in various embodiments, such as alpha, gamma, and/or amorphous forms of alumina.

Additionally, any metal oxide referred to herein may have various ratios of metal and oxygen. Embodiments may include any one or more metal-oxide compounds, each having an metal oxide ratio according to $M_xO_y$, where x may be any value, integer or non-integer, between approximately 1 and 100. In some embodiments, x may be between approximately 1 and 3 (and, again, need not be an integer). Likewise, y may be any value, integer or non-integer, between 0.1 and 100. In some embodiments, y may be between 2 and 4 (and, again, need not be an integer). In addition, various crystalline forms of $M_xO_y$ may be present in various embodiments, such as alpha, gamma, and/or amorphous forms of alumina.

Any interfacial material discussed herein may further comprise doped compositions. To modify the characteristics (e.g., electrical, optical, mechanical) of an interfacial material, a stoichiometric or non-stoichiometric material may be doped with one or more elements (e.g., Na, Y, Mg, N, P) in amounts ranging from as little as 1 ppb to 50 mol %. Some examples of interfacial materials include: NiO, $TiO_2$, $SrTiO_3$, $Al_2O_3$, $ZrO_2$, $WO_3$, $V_2O_5$, $MO_3$, ZnO, graphene, and carbon black. Examples of possible dopants for these interfacial materials include: Be, Mg, Ca, Sr, Ba, Sc, Y, Nb, Ti, Fe, Co, Ni, Cu, Ga, Sn, In, B, N, P, C, S, As, a halide, a pseudohalide (e.g., cyanide, cyanate, isocyanate, fulminate, thiocyanate, isothiocyanate, azide, tetracarbonylcobaltate, carbamoyldicyanomethanide, dicyanonitrosomethanide, dicyanamide, and tricyanomethanide), and Al in any of its oxidation states. References herein to doped interfacial materials are not intended to limit the ratios of component elements in interfacial material compounds.

Figure 2:
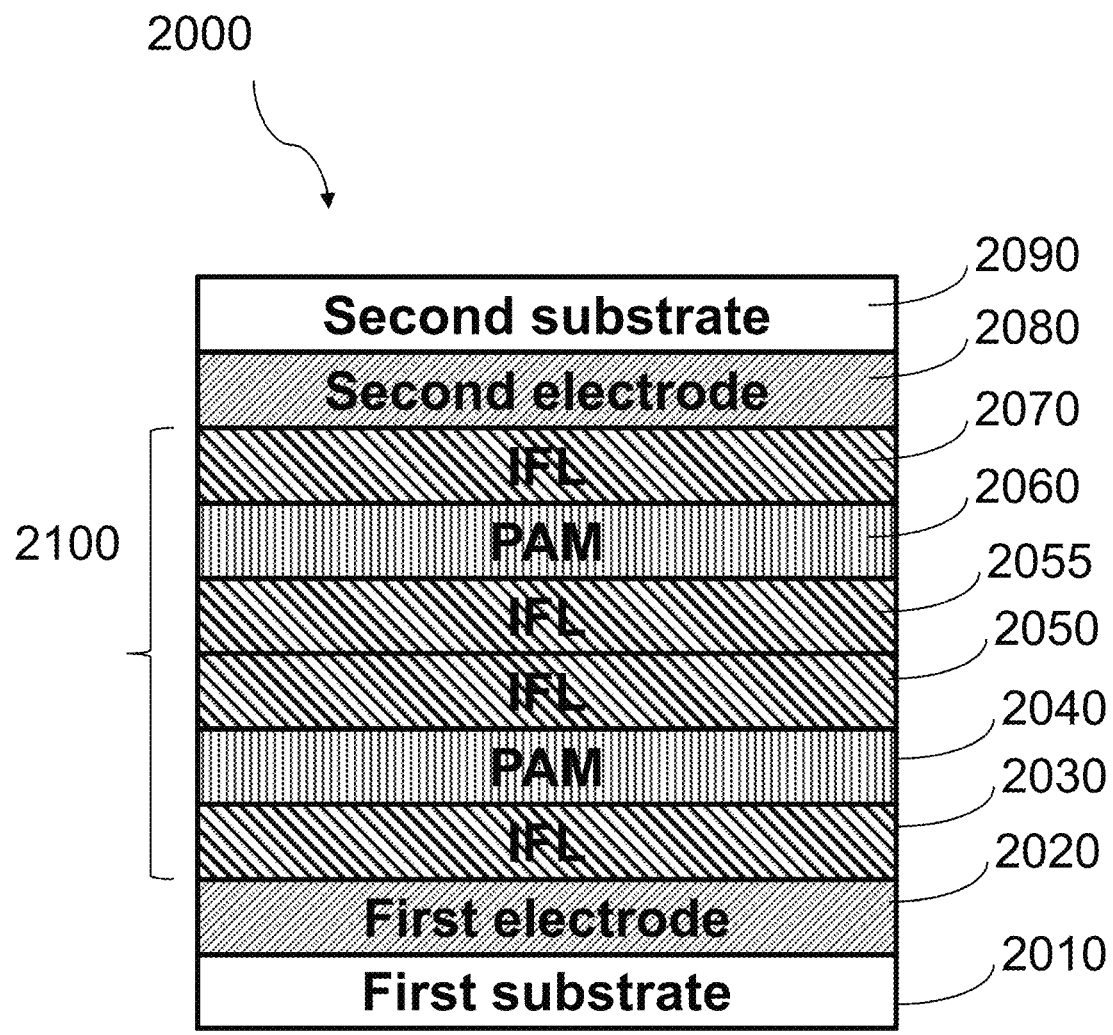
FIG. 2 is another example diagram illustrating components of an exemplar PV device according to some embodiments of the present disclosure.

Photoactive material 1040 may comprise any photoactive compound, such as any one or more of silicon (in some instances, single-crystalline silicon), cadmium telluride, cadmium sulfide, cadmium selenide, copper indium gallium selenide, gallium arsenide, germanium indium phosphide, one or more semiconducting polymers, and combinations thereof. In some embodiments, photoactive material 1040 may include one or more perovskite materials. Perovskite materials include compositions having the formula $CMX_3$, where C is a cation, M is a metal cation and X is an anion. In some embodiments, perovskite materials may deviate from the strict stoichiometry represented as $CMX_3$ and include both substoichiometric and superstoichiometric compositions. Such perovskites may be represented by the formula $C_xM_yX_z$ where x, y, and z are real numbers. In some embodiments, solid perovskite-containing material may be deposited by any suitable means (e.g., vapor deposition, solution deposition, direct placement of solid material, etc.). Devices according to various embodiments may include one, two, three, or more photoactive compounds (e.g., one, two, three, or more perovskite materials). In certain embodiments, photoactive material 1040 may include MAPbI$_3$, FAPbI$_3$, 5-AVA·HCl:FAPbI$_3$, CHP:FAPbI$_3$, Cs:FAPbI$_3$, FA:MA:CsPbI$_{3-y}$Br$_y$, CsPbI$_3$, and/or FA:MAPbI$_3$, where MA is methylammonium, FA is formamidinium, 5-AVA is 5-aminovaleric acid, and CHP is N-cyclohexyl-2-pyrrolidone. Additionally, photoactive material 1040 may include both substoichiometric and superstoichiometric compositions of the preceding perovskite materials. In embodiments including multiple photoactive materials, each of the photoactive materials may be separated by one or more interfacial layers. For example, FIG. 2 illustrates a stylized diagram of a perovskite material device 2000, according to some embodiments. The device 2000 includes first and second substrates 2010 and 2090. A first electrode 2020 is disposed upon an inner surface of the first substrate 2010, and a second electrode 2080 is disposed on an inner surface of the second substrate 2070. An active layer 2100 is sandwiched between the two electrodes 2020 and 2080. The active layer 2100 includes an IFL 2030; photoactive materials (PAM) layer 2040; IFL 2050 and 2055; PAM layer 2060 and IFL 1070. In some embodiments PAM layers 2040 and 2060 may be composed of different photoactive materials which are photoactive in response to different wavelengths of light.

Figure 3:
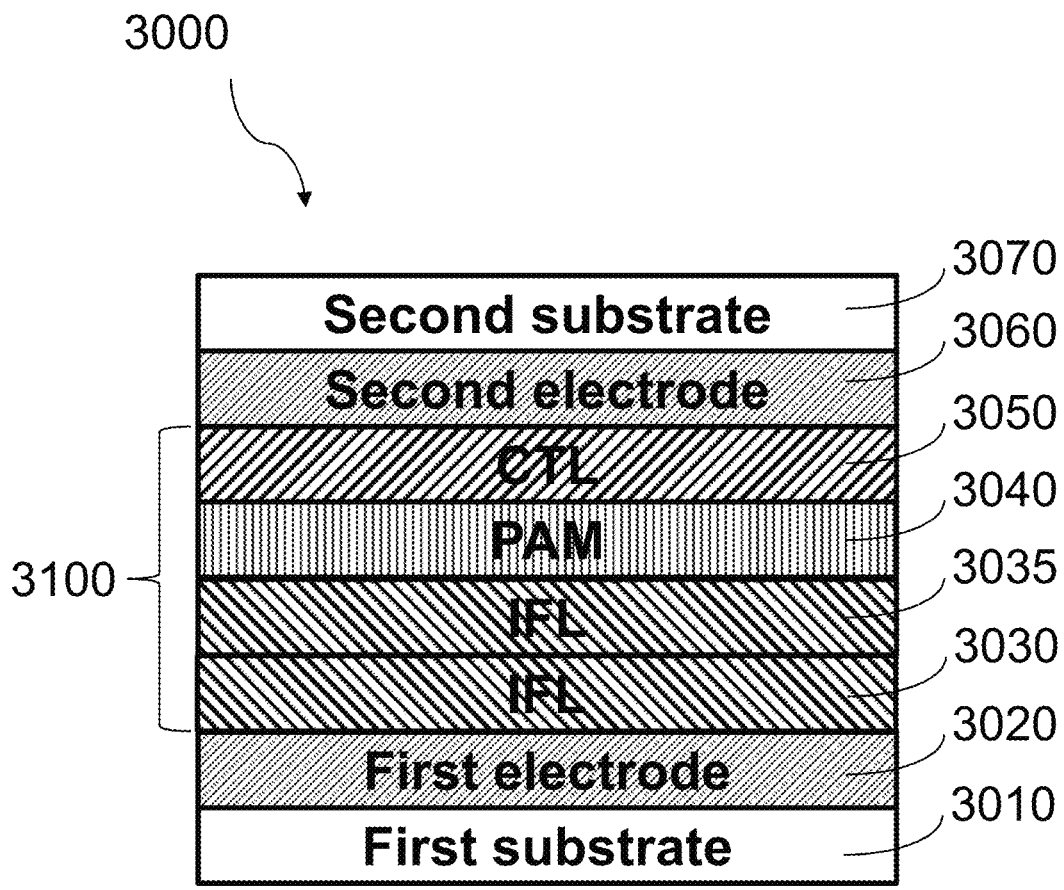
FIG. 3 is a stylized diagram illustrating components of an exemplar PV device according to some embodiments of the present disclosure.

Charge transport material (e.g., a charge transport material of charge transport layer 3050 in FIG. 3) may include solid-state charge transport material (i.e., a colloquially labeled solid-state electrolyte), or it may include a liquid electrolyte and/or ionic liquid. Any of the liquid electrolyte, ionic liquid, and solid-state charge transport material may be referred to as charge transport material. As used herein, "charge transport material" refers to any material, solid, liquid, or otherwise, capable of collecting charge carriers and/or transporting charge carriers. For instance, in PV devices according to some embodiments, a charge transport material may be capable of transporting charge carriers to an electrode. Charge carriers may include holes (the transport of which could make the charge transport material just as properly labeled "hole transport material") and electrons. Holes may be transported toward an anode, and electrons toward a cathode, depending upon placement of the charge transport material in relation to either a cathode or anode in a PV or other device. Suitable examples of charge transport material according to some embodiments may include any one or more of: perovskite material; I$^-$/I$_3^-$; Co complexes; polythiophenes (e.g., poly(3-hexylthiophene) and derivatives thereof, or P3HT); carbazole-based copolymers such as polyheptadecanylcarbazole dithienylbenzothiadiazole and derivatives thereof (e.g., PCDTBT); other copolymers such as polycyclopentadithiophene-benzothiadiazole and derivatives thereof (e.g., PCPDTBT); poly(triaryl amine) compounds and derivatives thereof (e.g., PTAA); Spiro-OMeTAD; fullerenes and/or fullerene derivatives (e.g., C$_{60}$, PCBM); and combinations thereof. In certain embodiments, charge transport material may include any material, solid or liquid, capable of collecting charge carriers (electrons or holes), and/or capable of transporting charge carriers. Charge transport material of some embodiments therefore may be n- or p-type active and/or semi-conducting material. Charge transport material may be disposed proximate to one of the electrodes of a device. In certain embodiments, the type of charge transport material may be selected based upon the electrode to which it is proximate. For example, if the charge transport material collects and/or transports holes, it may be proximate to an anode so as to transport holes to the anode. However, the charge transport material may instead be placed proximate to a cathode and be selected or constructed so as to transport electrons to the cathode.

In some embodiments, another IFL may be disposed between an IFL and an electrode such as is illustrated in FIG. 3 described below.

FIG. 3 illustrates another stylized diagram of a perovskite material device 3000 according to some embodiments. The device 3000 includes first and second substrates 3010 and 3070. The first electrode 3020 is disposed upon an inner surface of the first substrate 3010, and a second electrode 3060 is disposed on an inner surface of the second substrate 3070. An active layer 3100 is sandwiched between the two electrodes 3020 and 3060. The active layer 3100 includes a first IFL 3030, and a second IFL 3035; the photoactive materials (PAM) 3040; and the CTL 3040. In certain embodiments, the device 3000 may comprise more than one IFL 3010.

According to various embodiments, the device 2000 may optionally include an interfacial layer 2030 between any two other layers and/or materials, although the devices 2000 need not contain any interfacial layers. For example, a perovskite material device may contain zero, one, two, three, four, five, or more interfacial layers.

As will be apparent to one of ordinary skill in the art with the benefit of this disclosure, various other embodiments are possible, such as a device with multiple photoactive layers. In some embodiments, as discussed above, each photoactive layer may be separated by an interfacial layer.

Figure 4:
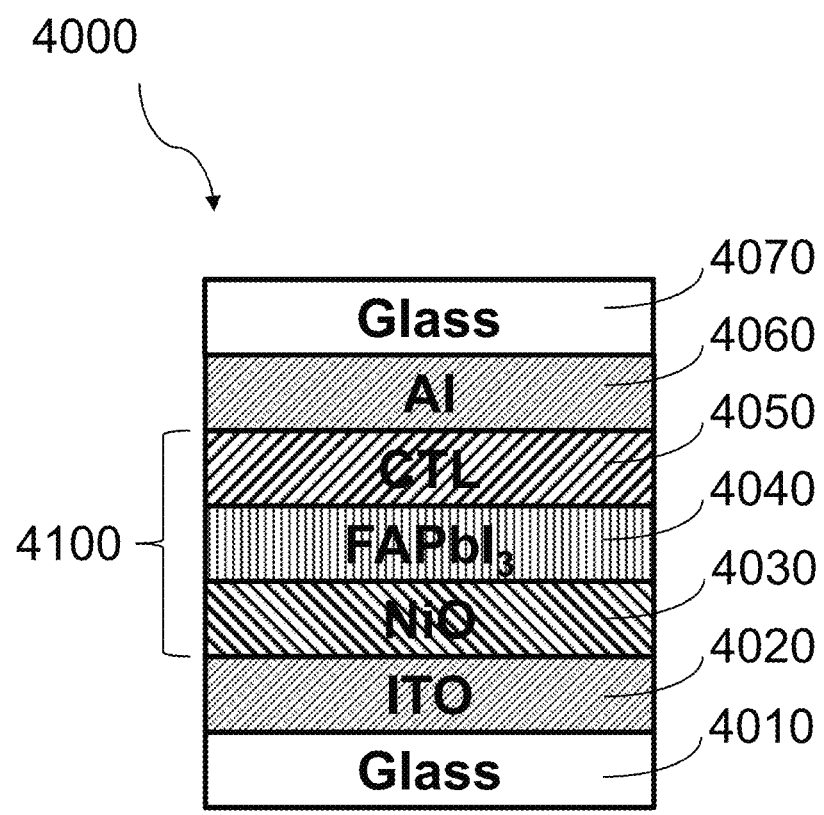
FIG. 4 is another stylized diagram illustrating components of an exemplar PV device according to some embodiments of the present disclosure.

FIG. 4 depicts an example device 4000 in accordance with various embodiments. The device 4000 illustrates embodiments including first and second glass substrates 4010 and 4070. A first electrode (ITO) 4020 is disposed upon an inner surface of the first substrate 4010, and a second electrode (Al) 4060 is disposed on an inner surface of the second substrate 4070. An active layer 4100 is sandwiched between the two electrodes 4020 and 4060. The active layer 4100 includes an IFL (e.g., NiO) 4030, a photoactive material (e.g., MAPbI$_3$, FAPbI$_3$) 4040, and a charge transport layer 4050.

Figure 5:
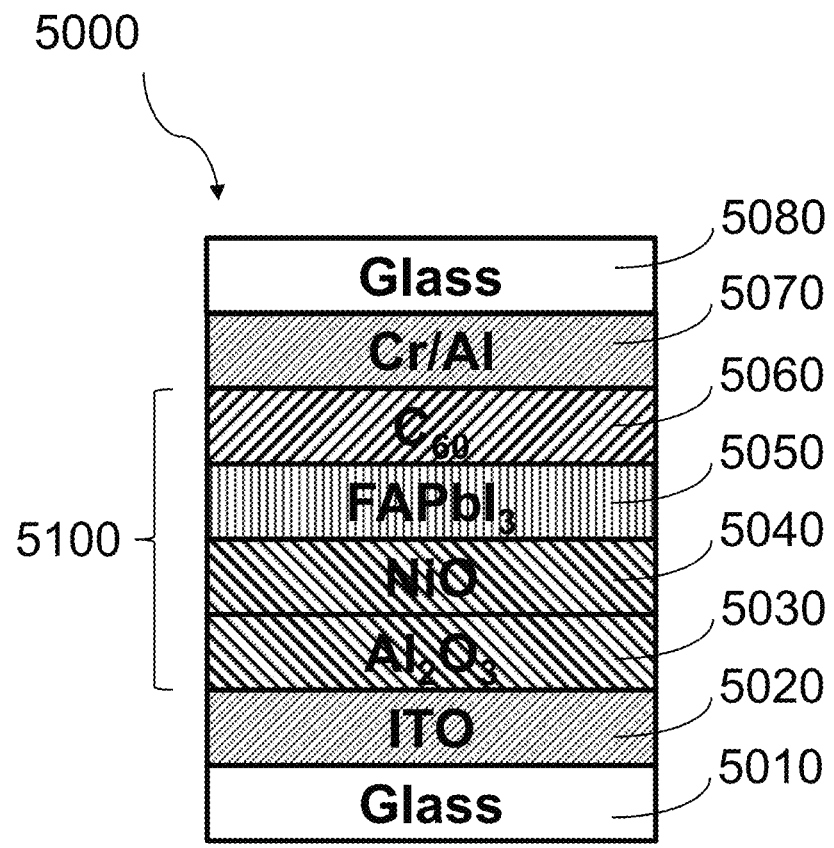
FIG. 5 is another stylized diagram illustrating components of an exemplar PV device according to some embodiments of the present disclosure.

FIG. 5 depicts another example device 5000 in accordance with various embodiments. The device 5000 illustrates embodiments including first and second glass substrates 5010 and 5080. A first electrode (ITO) 5020 is disposed upon an inner surface of the first substrate 5010, and a second electrode 5070 is disposed on an inner surface of the second substrate 5080. Second electrode 5070 may be a chromium-aluminum bilayer (Cr/Al), wherein a layer of chromium is coated with a layer of aluminum to form the bilayer. An active layer 5100 is sandwiched between the two electrodes 5020 and 5070. The active layer 5100 includes an IFL (e.g., Al$_2$O$_3$) 4030, a second IFL (e.g., NiO) 5040, a photoactive material (e.g., MAPbI$_3$, FAPbI$_3$) 5050, and a charge transport layer (e.g., C$_{60}$) 5060.

Figure 6:
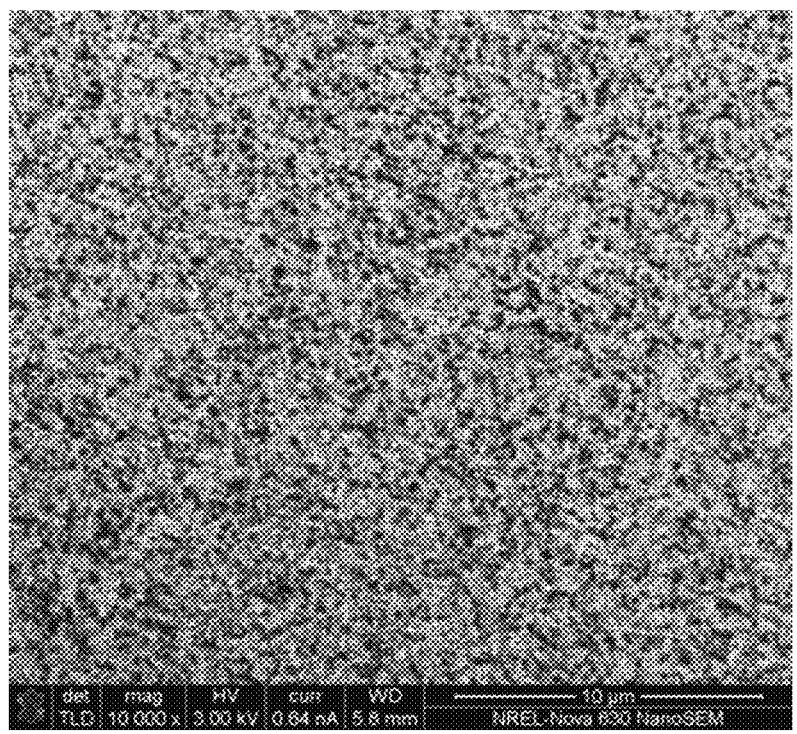
FIG. 6 illustrates SEM (scanning electron microscope) photos of an example NiO layer from the prior art.
Figure 6:
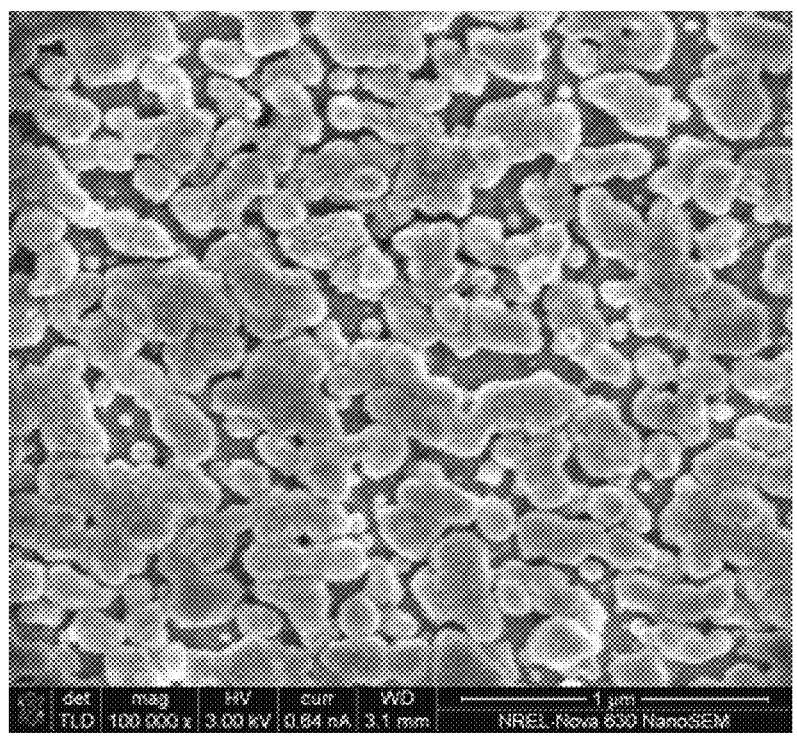

FIG. 6 illustrates SEM photos of an example NiO layer produced by methods prior to those disclosed herein. The SEM photos are of the same NiO layer, taken at 10,000× magnification (top) and 100,000× magnification (bottom). The NiO layer shown was produced by the formulation of a NiO precursor solution disclosed in Steirer et al., J. Mater. Chem. A, 2015, 3, 10949, *Nickel oxide interlayer films from nickel formate-ethylenediamine precursor: influence of annealing on thin film properties and photovoltaic device performance*. The SEM images show that NiO layers formed by the prior method has poor coverage and an irregular grain structure, indicated by the substantial number of large and distinct dark and light areas seen in the image. This may lead to (i) defects that cause parasitic absorption losses when the NiO layer is applied in a photovoltaic device, (ii) incomplete and non-uniform coverage that causes shunting and/or series resistance losses, and/or (iii) undesirable surface roughness.

Figure 7A:
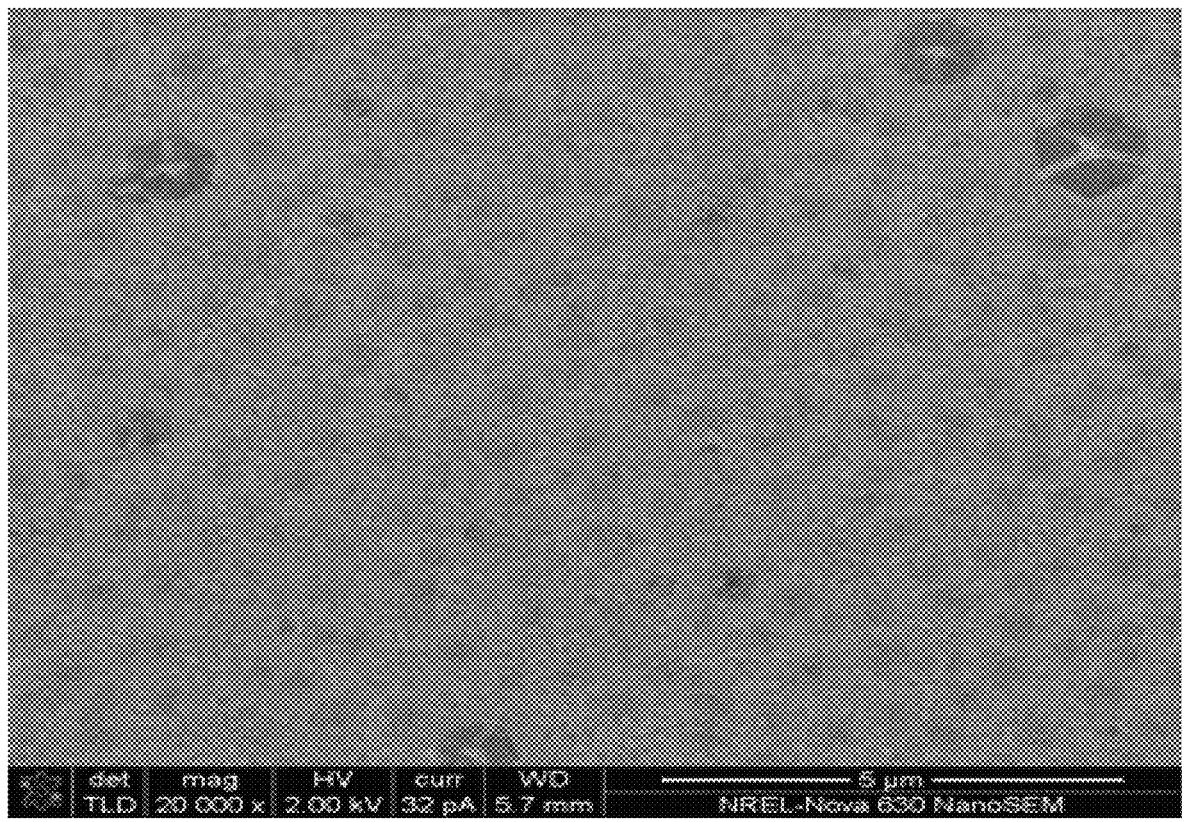
FIG. 7A illustrates an SEM photo of an example NiO layer, taken at 20,000× magnification, according to some embodiments of the present disclosure.
Figure 7B:
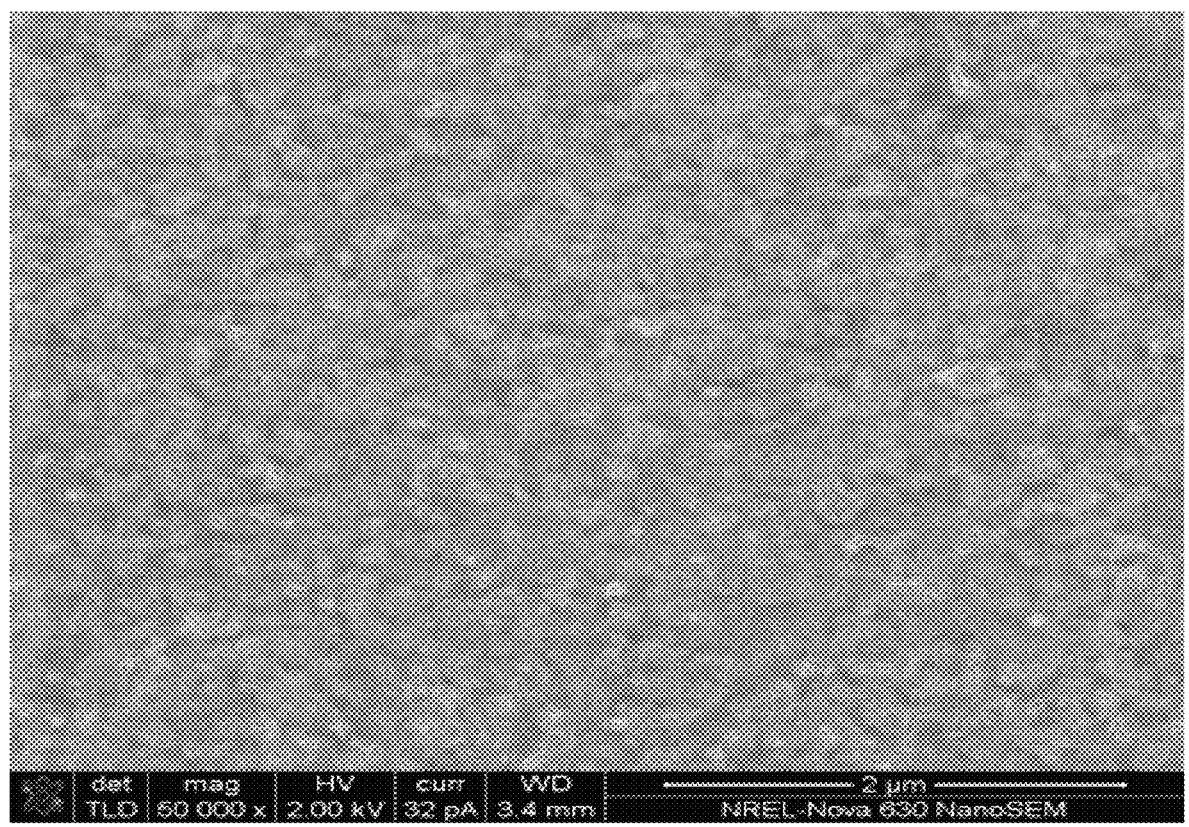
FIG. 7B illustrates an SEM photo of an example NiO layer, taken at 50,000× magnification, according to some embodiments of the present disclosure.
Figure 7C:
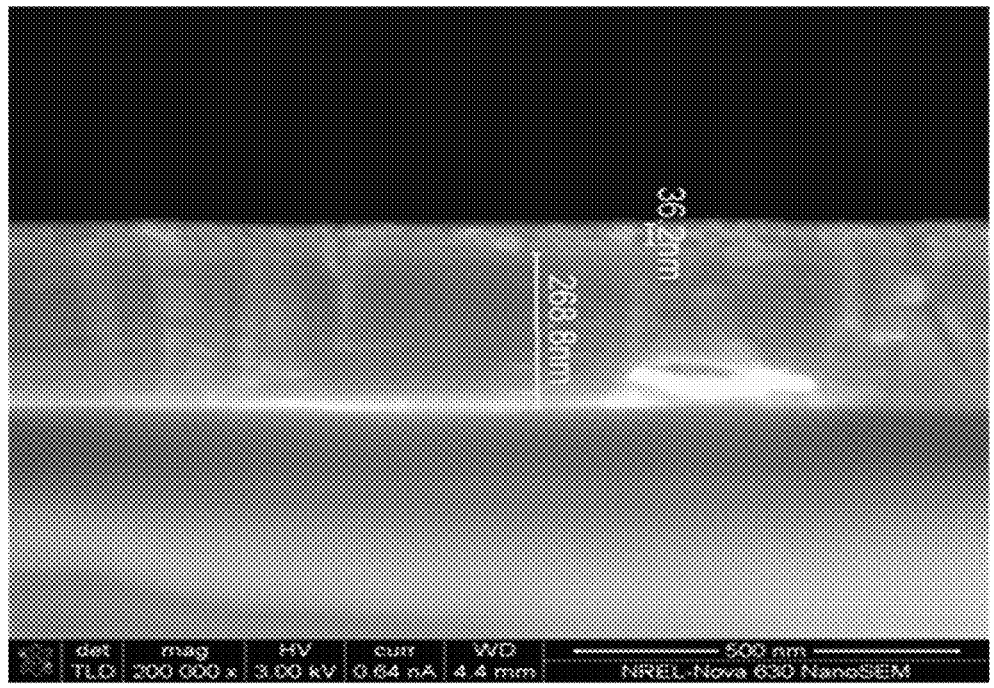
FIG. 7C illustrates SEM photos of an example NiO layer, taken at 200,000× magnification, according to some embodiments of the present disclosure.
Figure 7C:
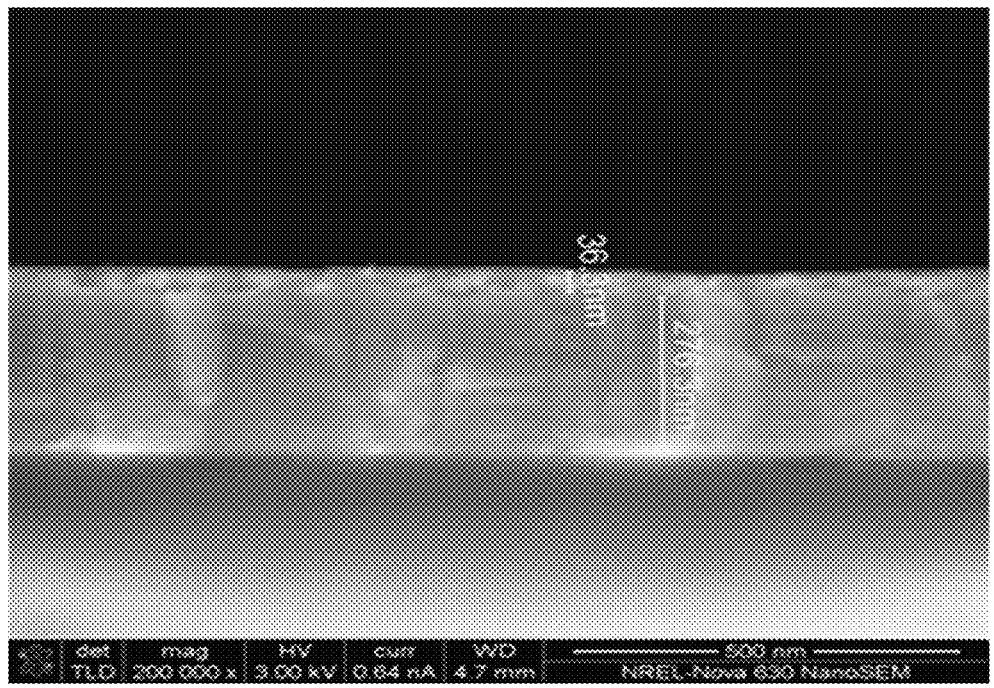

FIG. 7A-C illustrates SEM photos of an example NiO layer disclosed herein, in accordance with certain embodiments. The NiO layer formed based on the method described herein shows a superior film coverage compared to the NiO layer shown in FIG. 6. In this embodiment, the formulation of the NiO precursor ink deposited to form the NiO layer may comprise 0.95 M nickel nitrate hexahydrate and 213 mol % ethanolamine in ethylene glycol, where the mole percentage of ethanolamine is relative to Ni moles. FIG. 7A illustrates an image of the surface of the NiO layer taken at 20,000× magnification, FIG. 7B illustrates an image of the surface of the NiO layer taken at 50,000× magnification, and FIG. 7C illustrates two images taken of a profile of the NiO layer taken at 200,000× magnification. As can be seen from the images the NiO layer produced by the methods disclosed herein has a much more uniform grain structure than the NiO layer produced by prior methods illustrated in FIG. 6, leading to improved coverage and lower parasitic absorption when applied in a photovoltaic device as described herein.

Figure 8A:
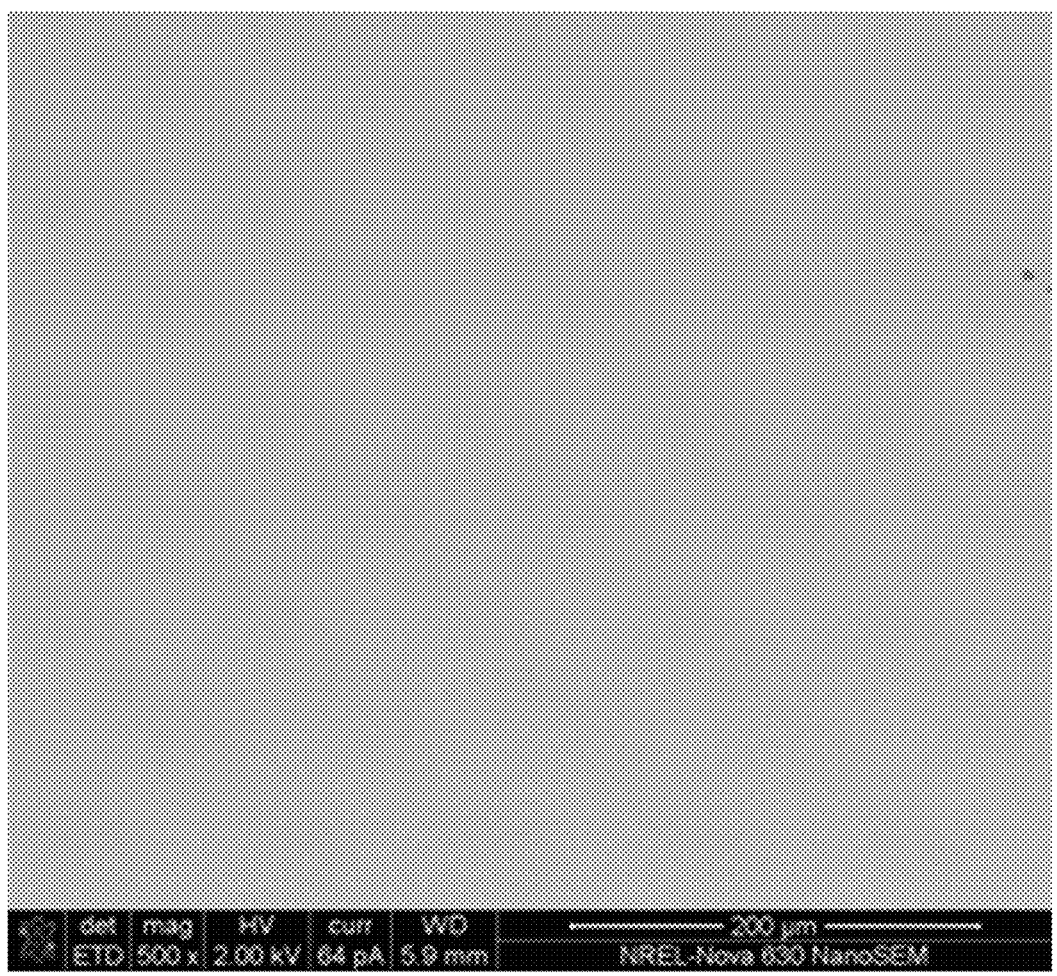
FIG. 8A illustrates an SEM photo of another example NiO layer, taken at 5,000× magnification, according to some embodiments of the present disclosure.
Figure 8B:
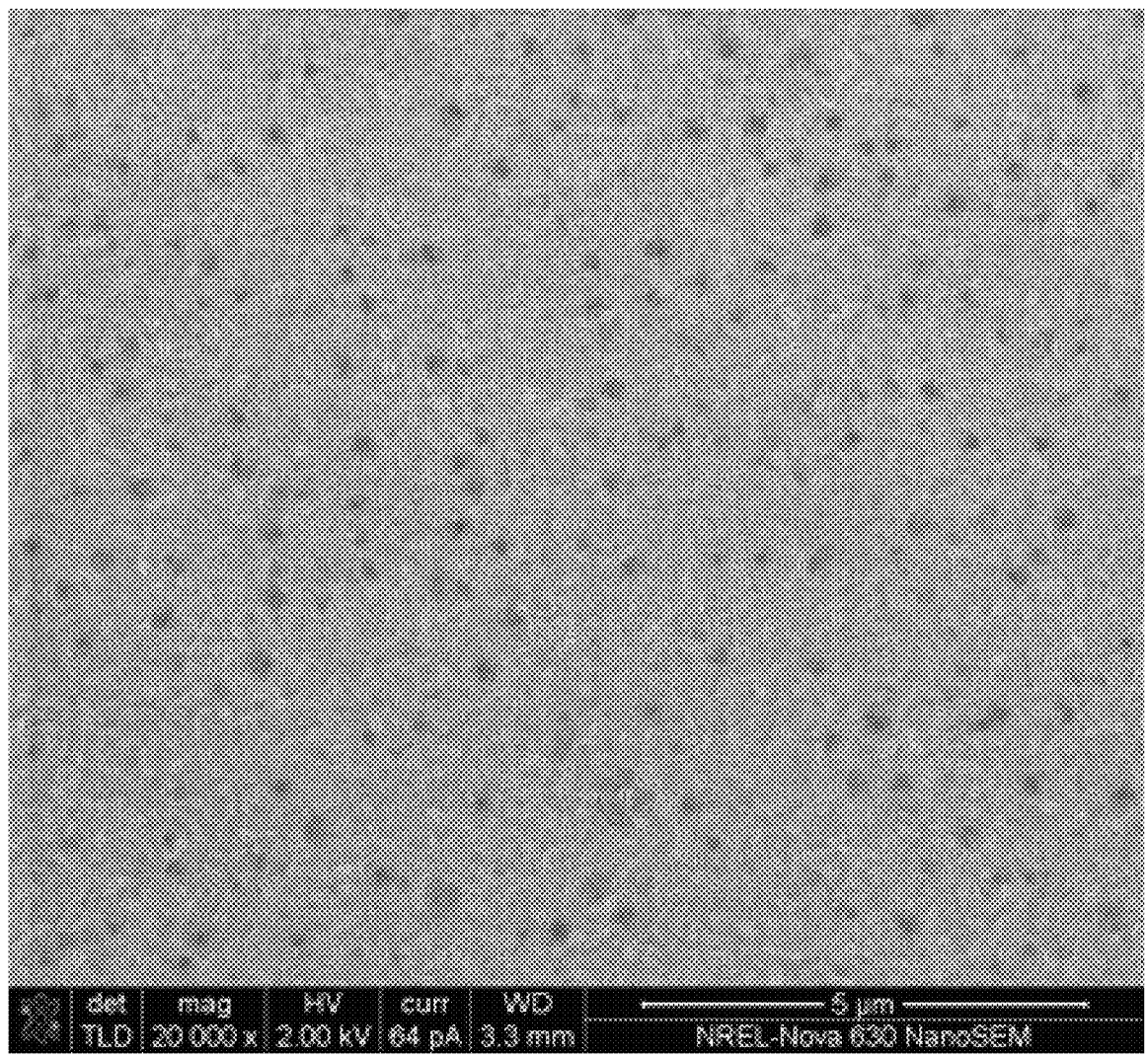
FIG. 8B illustrates an SEM photo of another example NiO layer, taken at 20,000× magnification, according to some embodiments of the present disclosure.
Figure 8C:
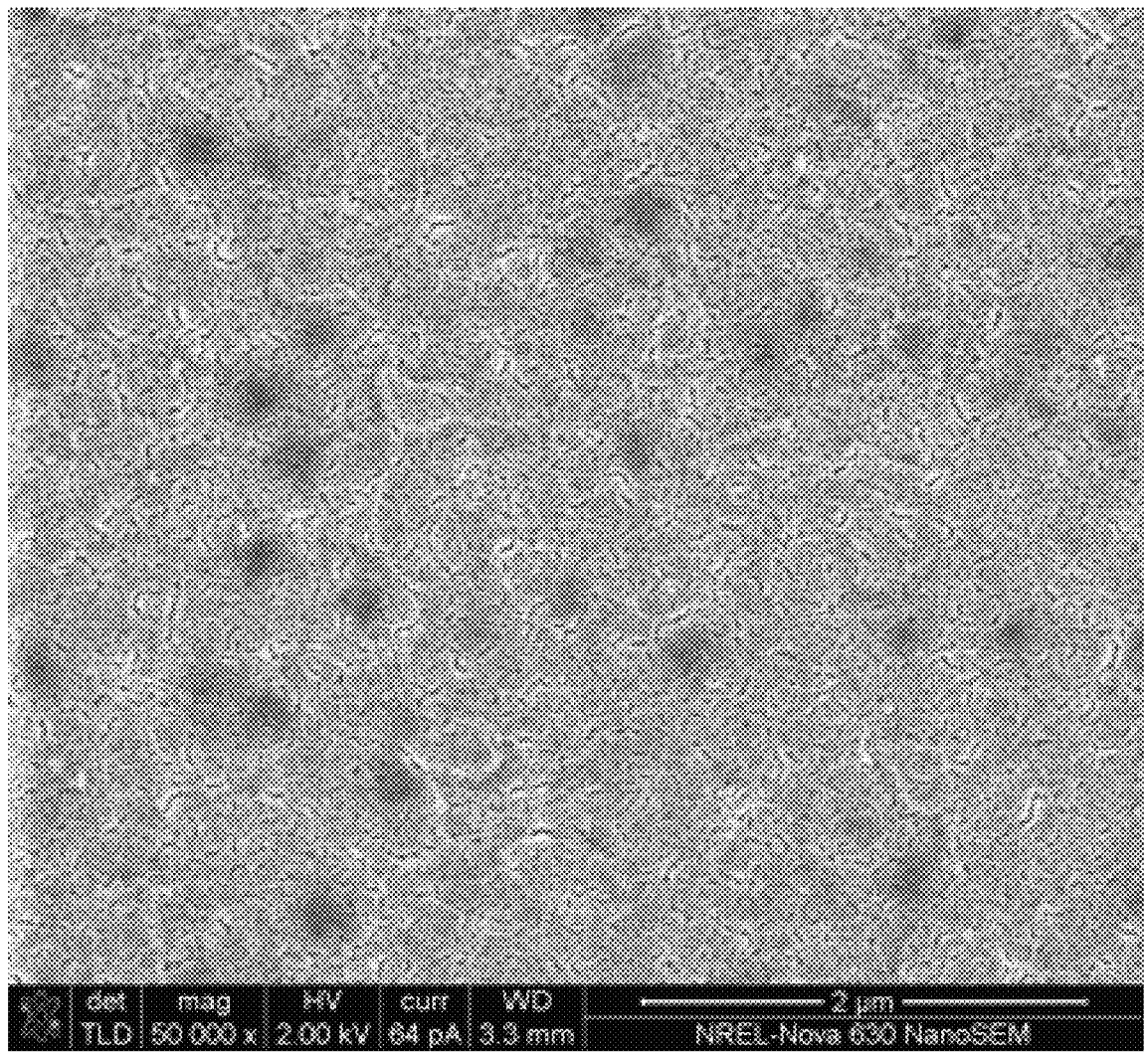
FIG. 8C illustrates an SEM photo of another example NiO layer, taken at 50,000× magnification, according to some embodiments of the present disclosure.
Figure 8D:
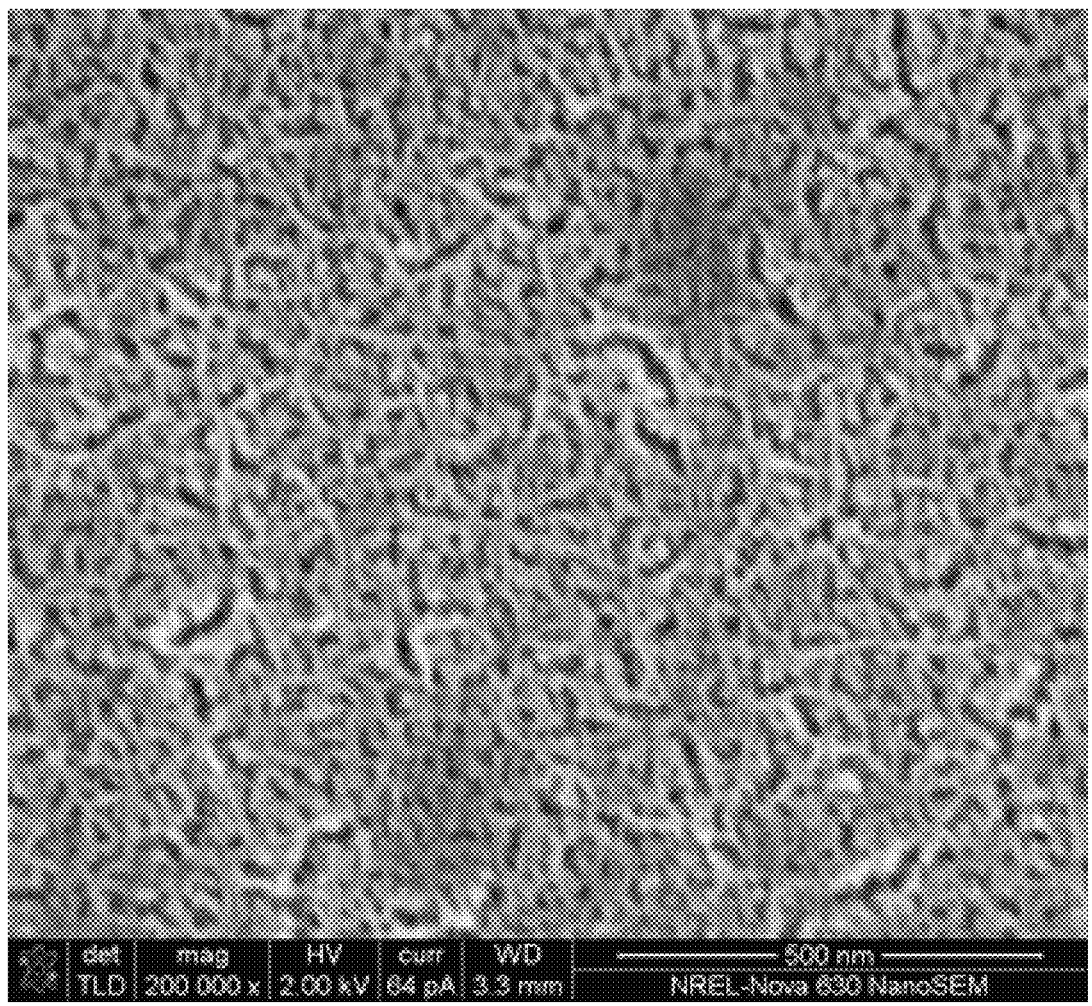
FIG. 8D illustrates an SEM photo of another example NiO layer, taken at 200,000× magnification, according to some embodiments of the present disclosure.
Figure 8E:
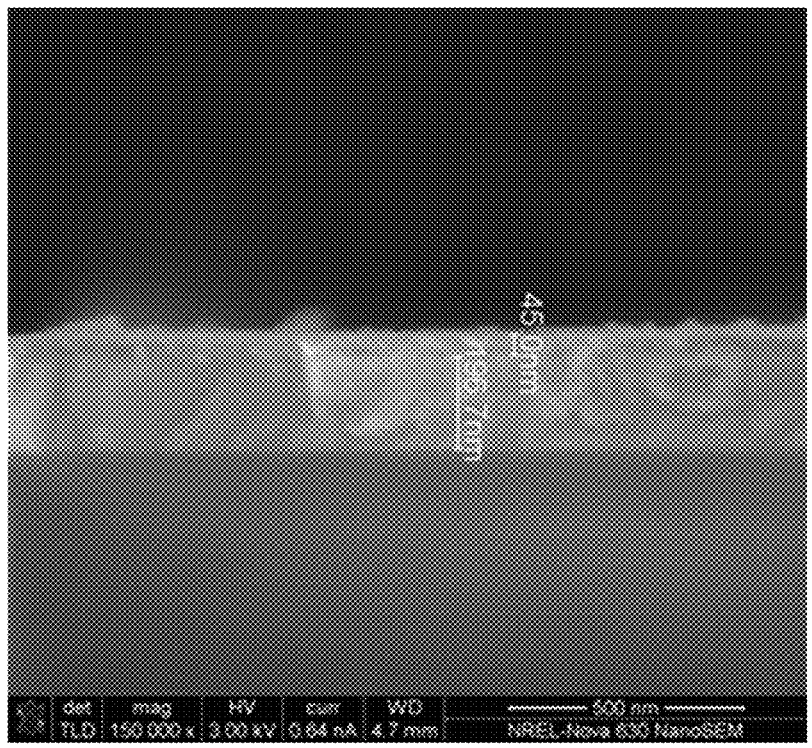
FIG. 8E illustrates SEM photos of another example NiO layer, taken at 150,000× magnification, according to some embodiments of the present disclosure.
Figure 8E:
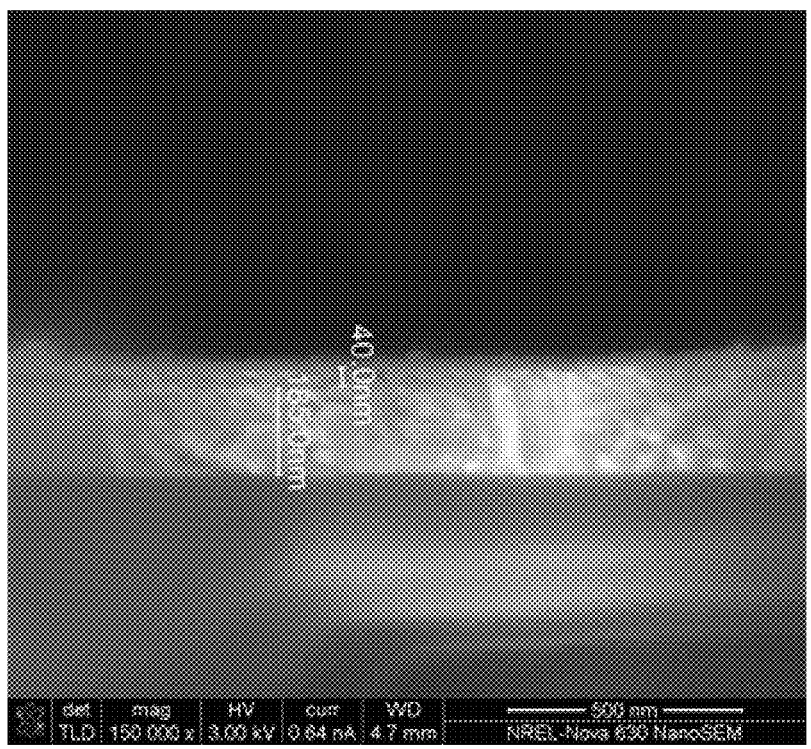

FIGS. 8A-E illustrate SEM photos of another example NiO layer disclosed herein, in accordance with certain embodiments. The NiO layer formed based on the method described herein shows a superior film coverage comparing to the NiO layer shown in FIG. 6, which may result in a better electronic performance. FIG. 8A illustrates an image of the surface of the NiO layer taken at 5,000× magnification, FIG. 8B illustrates an image of the surface of the NiO layer taken at 20,000× magnification, FIG. 8C illustrates an image of the surface of the NiO layer taken at 50,000× magnification, FIG. 8D illustrates an image of the surface of the NiO layer taken at 200,000× magnification, and FIG. 8E illustrates two images taken of a profile of the NiO layer taken at 150,000× magnification. In this embodiment, the formulation of the NiO precursor ink deposited to form the NiO layer may comprise 0.95 M nickel nitrate hexahydrate, 5 mol % copper acetate monohydrate, 231 mol % ethanolamine, and 488 mol % water in ethylene glycol, where the mole percentage of copper acetate monohydrate, ethanolamine, and water are relative to Ni moles. As with the images show in FIGS. 7A-C, the NiO layer pictured in FIGS. 8A-E display a significantly more uniform structure than those of the NiO layer produced by prior methods pictured in FIG. 6. For example, in FIG. 8D the grain boundaries, shown as dark areas, are substantially smaller and more regularly spaced when viewed at 200,000× magnification than the grain boundaries, shown as dark areas, in FIG. 6 are when viewed at 100,000× magnification.

Figure 9A:
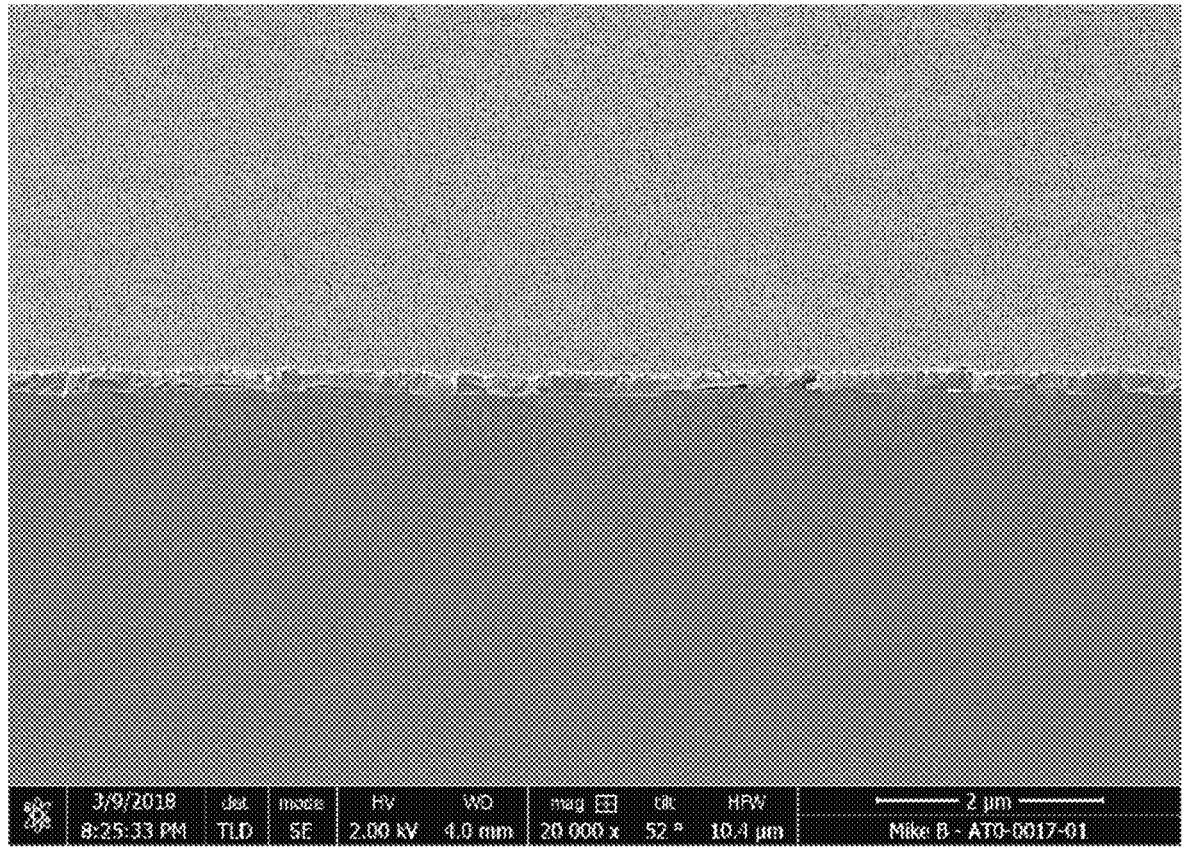
FIG. 9A illustrates an SEM photo of another example NiO layer, taken at 20,000× magnification, according to some embodiments of the present disclosure.
Figure 9B:
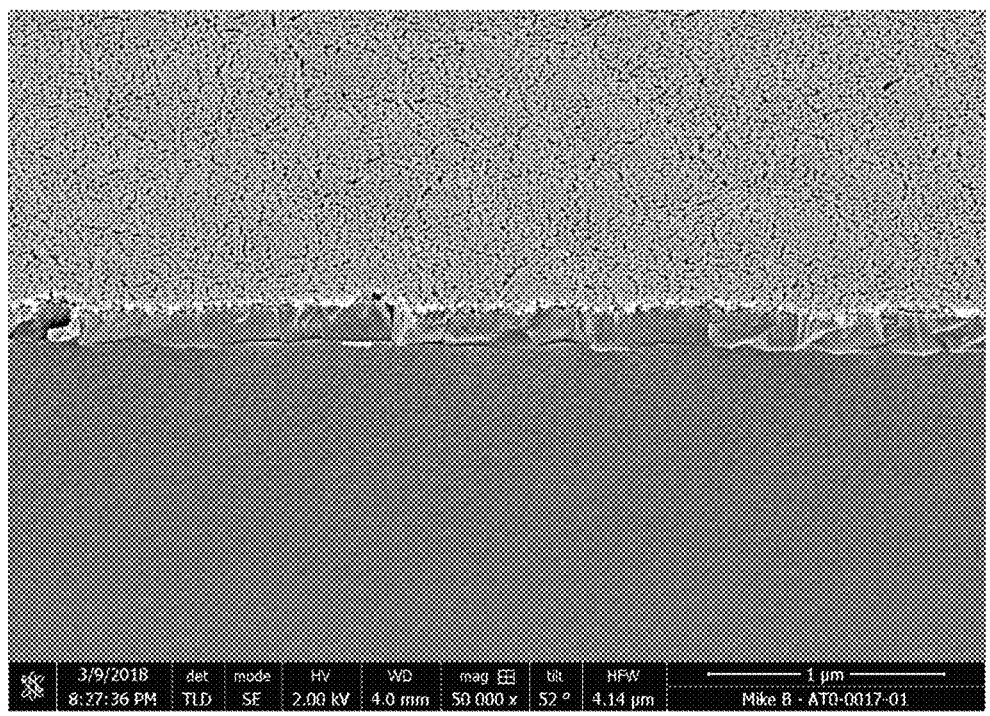
FIG. 9B illustrates an SEM photo of another example NiO layer, taken at 50,000× magnification, according to some embodiments of the present disclosure.
Figure 9C:
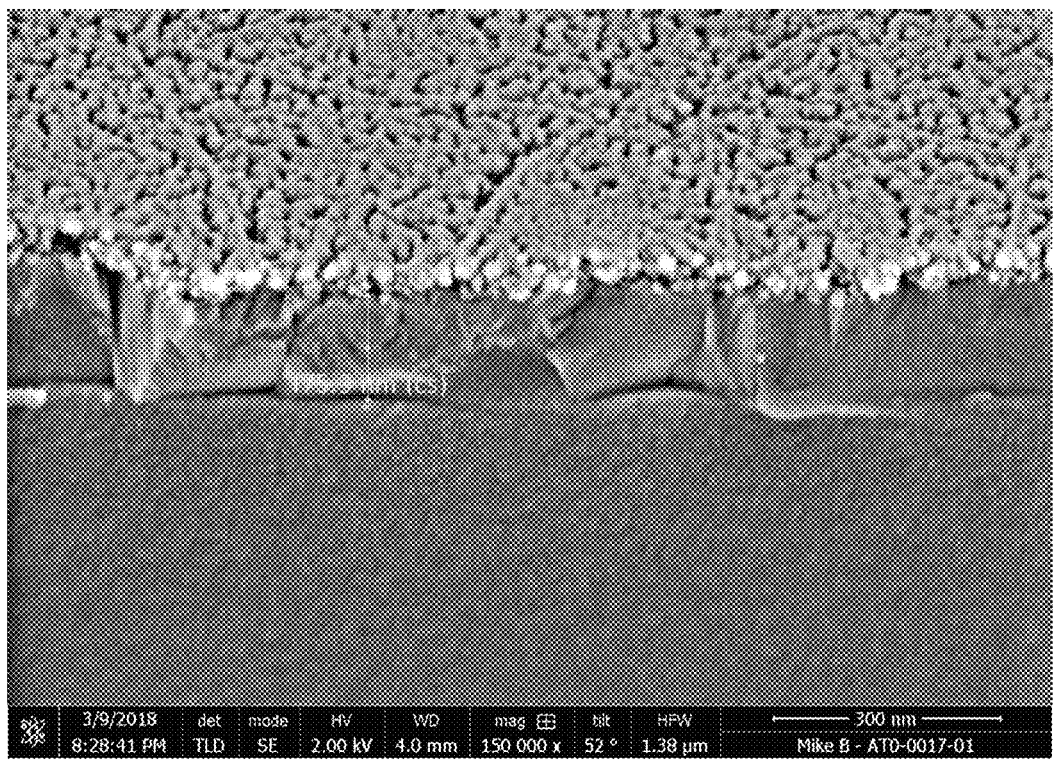
FIG. 9C illustrates an SEM photo of another example NiO layer, taken at 150,000× magnification, according to some embodiments of the present disclosure.

FIGS. 9A-C illustrate SEM photos of the example NiO layer as described herein having 5 mol % Cu and 5 mol % acetate in the NiO precursor ink used to form the NiO layer. FIGS. 9A-C show profile images of the NiO layer disposed in a photovoltaic device, as captured at 20,000×, 50,000× and 150,000× magnification, respectively. The NiO layer can be seen in the images as a "band" running across the center of each image.

Figure 10A:
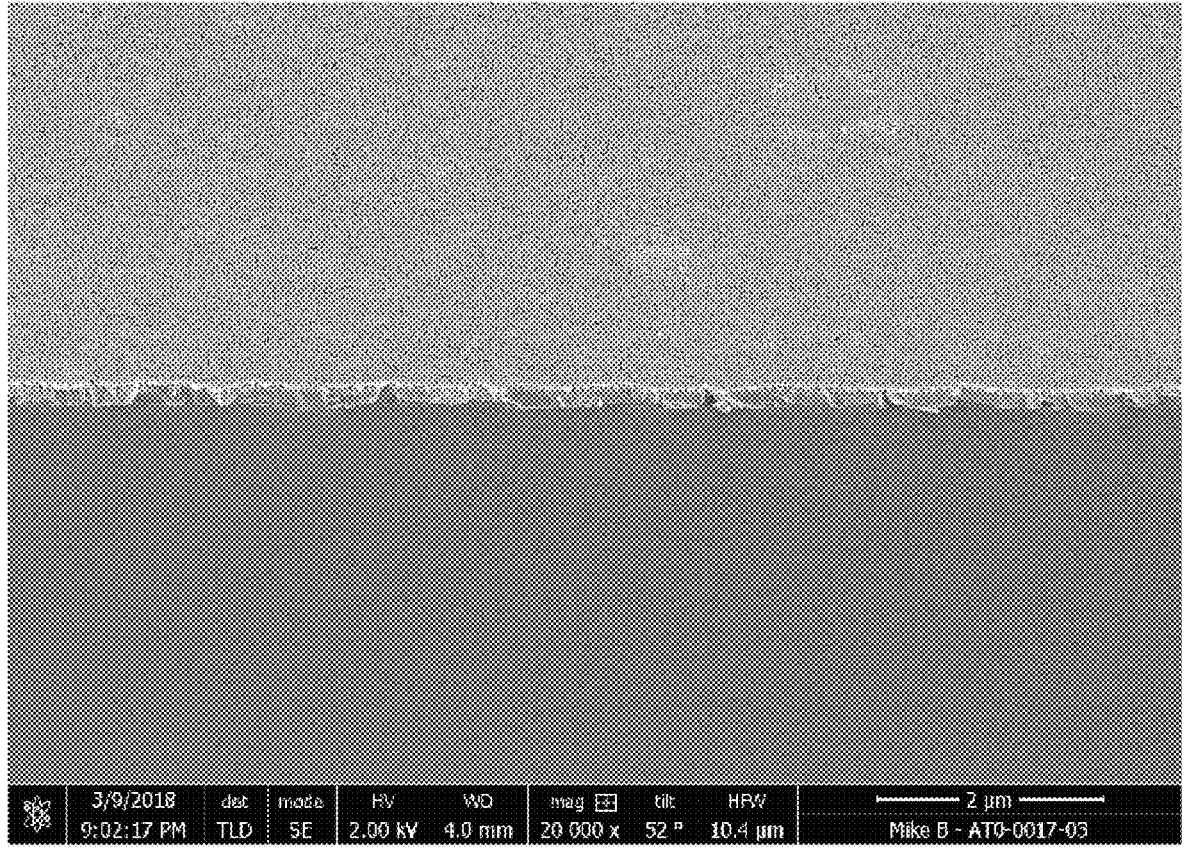
FIG. 10A illustrates an SEM photo of another example NiO layer, taken at 20,000× magnification, according to some embodiments of the present disclosure.
Figure 10B:
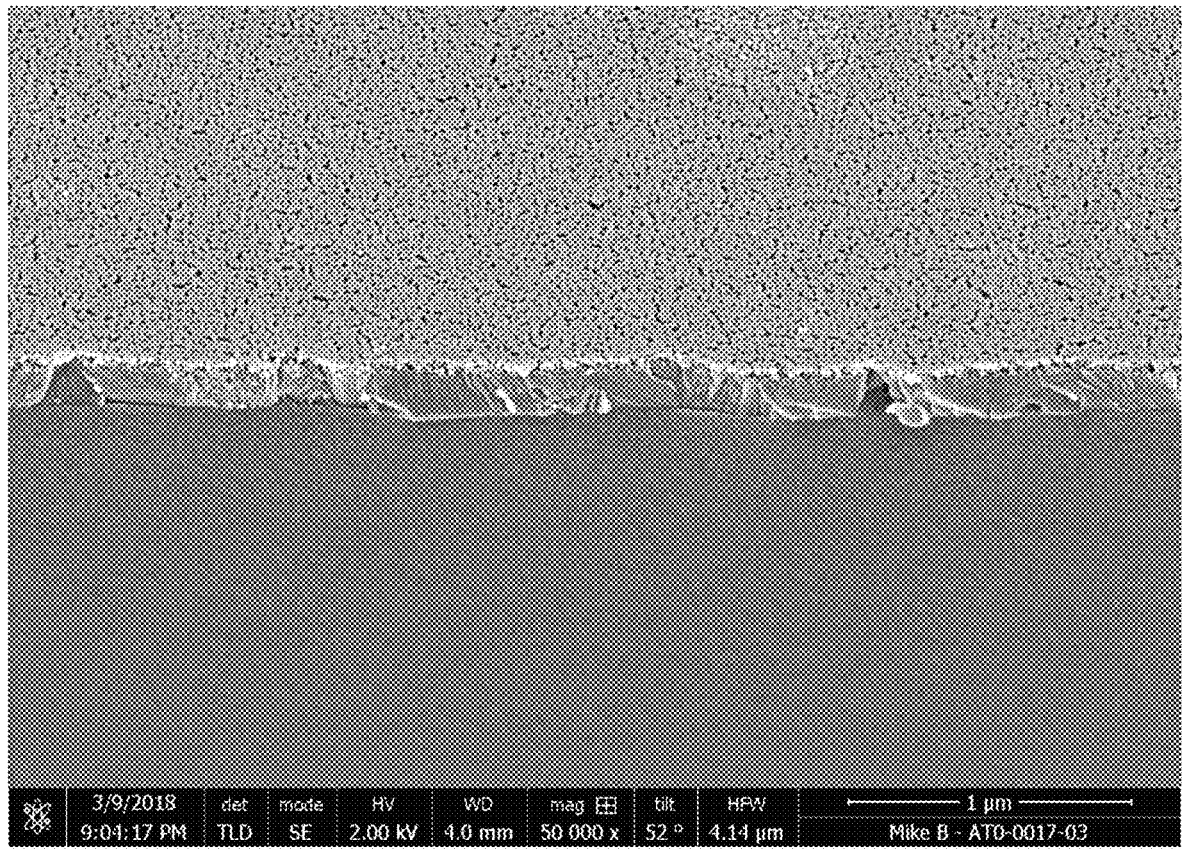
FIG. 10B illustrates an SEM photo of another example NiO layer, taken at 50,000× magnification, according to some embodiments of the present disclosure.
Figure 10C:
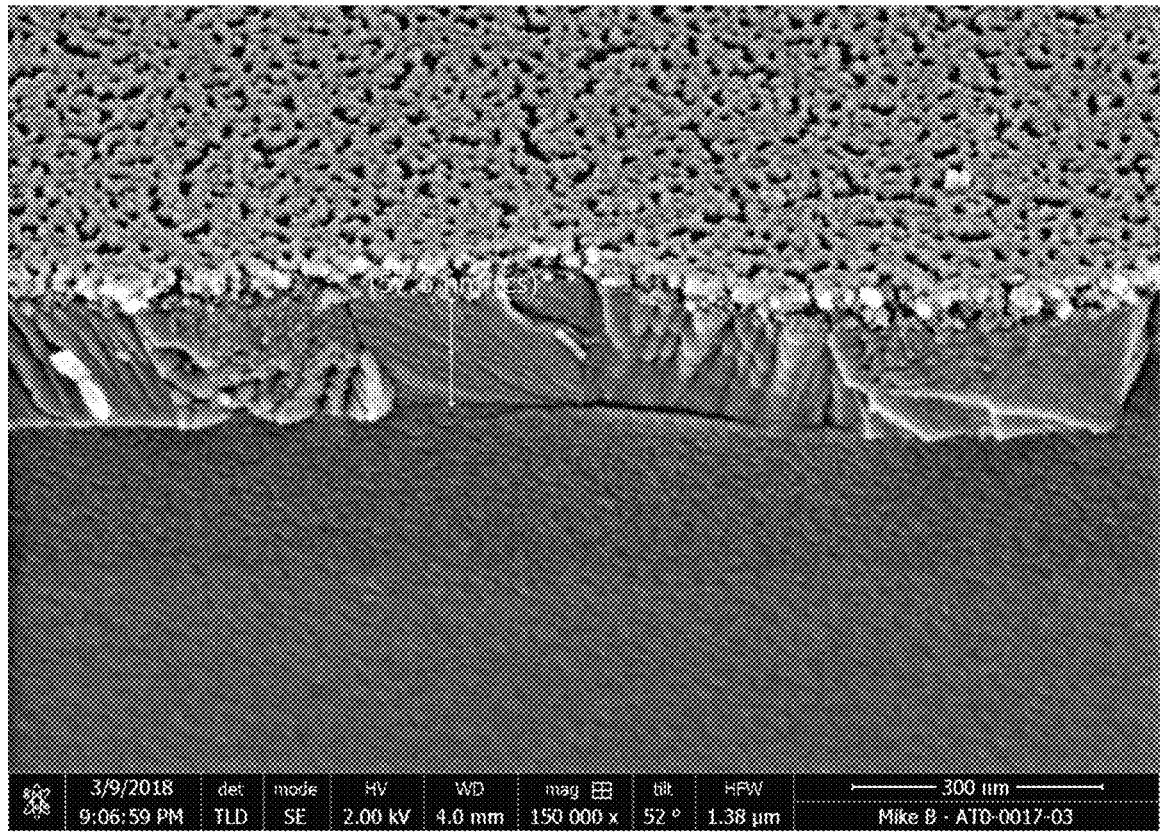
FIG. 10C illustrates an SEM photo of another example NiO layer, taken at 150,000× magnification, according to some embodiments of the present disclosure.

FIGS. 10A-C illustrate SEM photos of another example NiO layer as described herein having 5 mol % Cu and 12.5 mol % acetate in the NiO precursor ink used to form the NiO layer. FIGS. 10A-C show profile images of the NiO layer disposed in a photovoltaic device, as captured at 20,000×, 50,000× and 150,000× magnification, respectively. The NiO layer can be seen in the images as a "band" running across the center of each image.

Figure 11A:
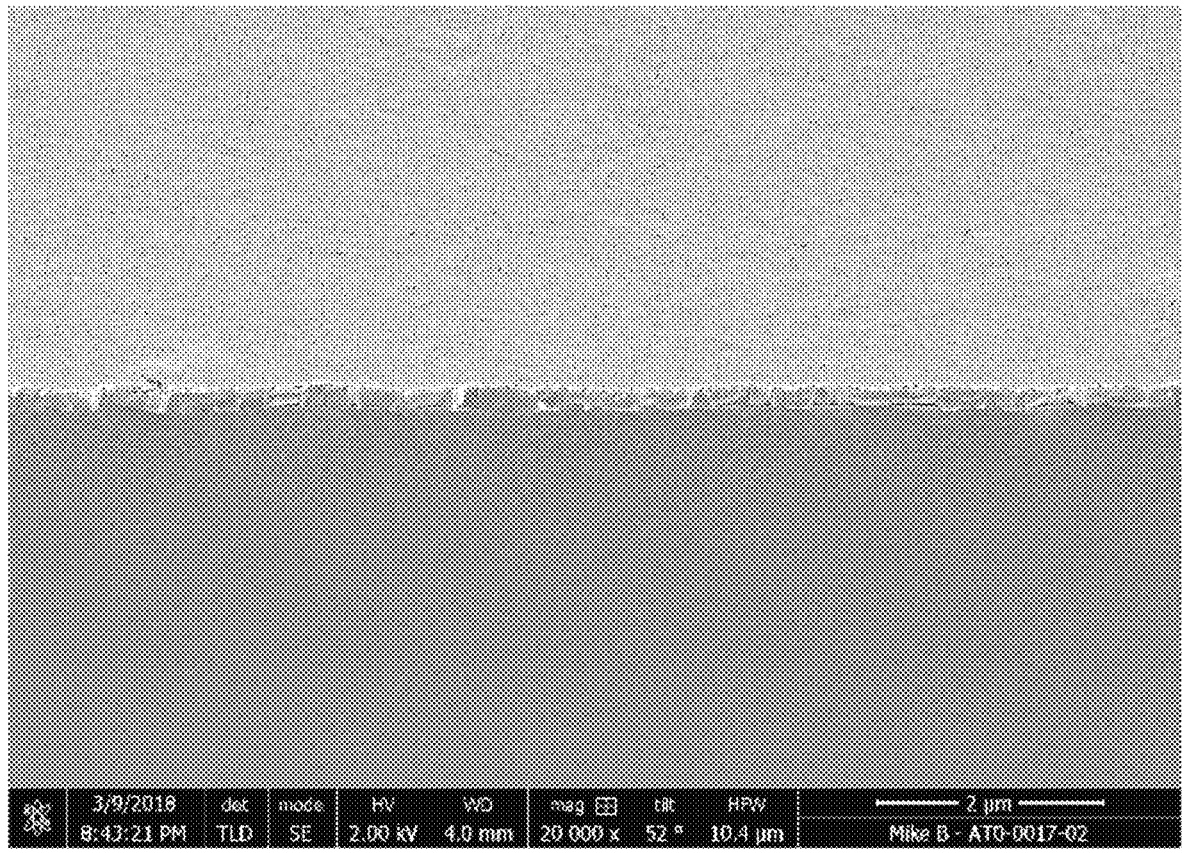
FIG. 11A illustrates an SEM photo of yet another example NiO layer, taken at 20,000× magnification, according to some embodiments of the present disclosure.
Figure 11B:
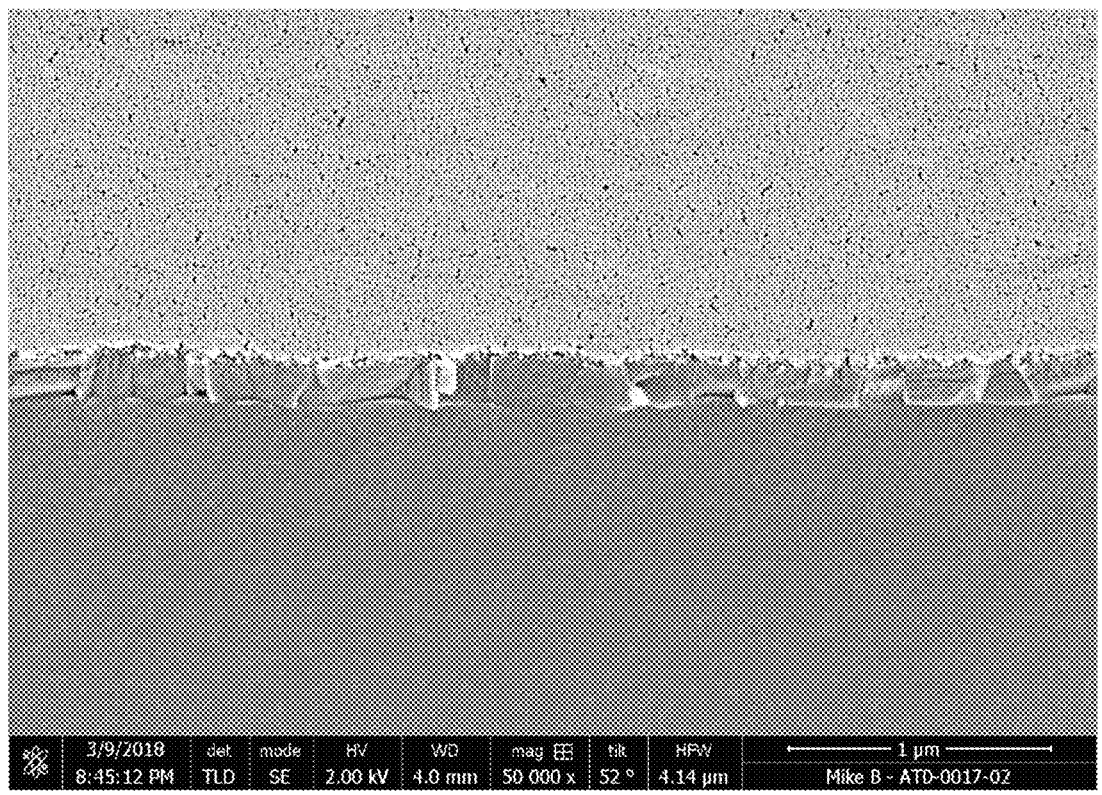
FIG. 11B illustrates an SEM photo of another example NiO layer, taken at 50,000× magnification, according to some embodiments of the present disclosure.
Figure 11C:
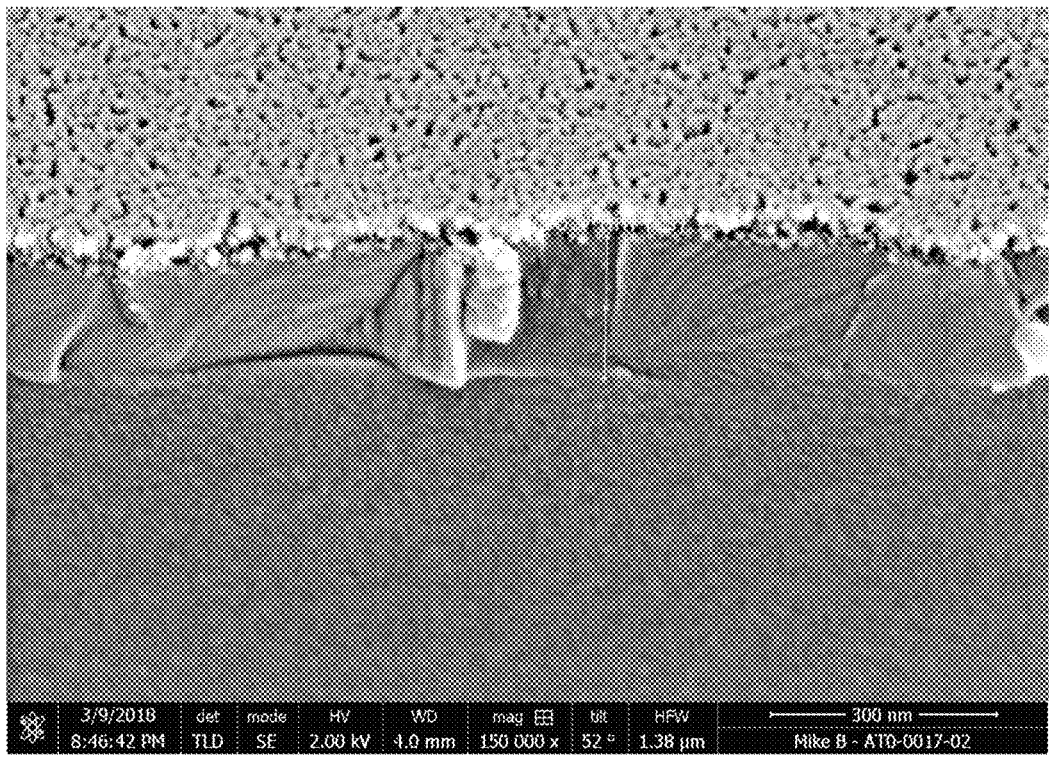
FIG. 11C illustrates an SEM photo of another example NiO layer, taken at 150,000× magnification, according to some embodiments of the present disclosure.

FIGS. 11A-C illustrate SEM photos of yet another example NiO layer, in accordance with certain embodiments. FIGS. 10A-C show profile images of the NiO layer disposed in a photovoltaic device, as captured at 20,000×, 50,000× and 150,000× magnification, respectively. The illustrated NiO layer formed based on the method described herein shows a superior film coverage comparing to the NiO layer shown in FIG. 5, which may result in a better electronic performance. In this embodiment, the formulation of the NiO precursor ink may comprise 0.87 M nickel nitrate hexahydrate, 0.12 M nickel acetate tetrahydrate, 200 mol % ethanolamine, and 464 mol % water in ethylene glycol, where the mole percentage of ethanolamine, and water are relative to Ni moles.

Figure 12:
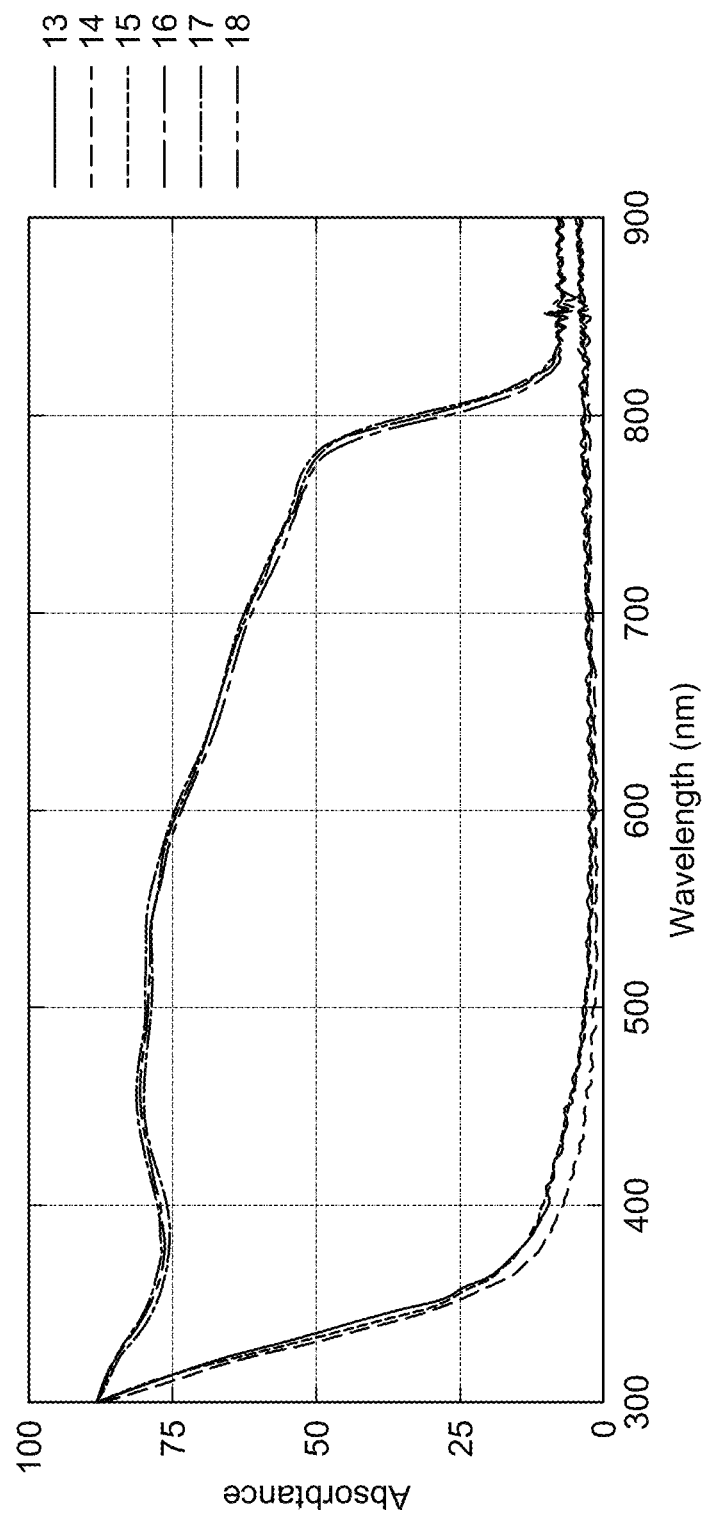
FIG. 12 is an UV-Visible absorptance diagram of NiO and perovskite on NiO layers according to some embodiments of the present disclosure.
Figure 13:
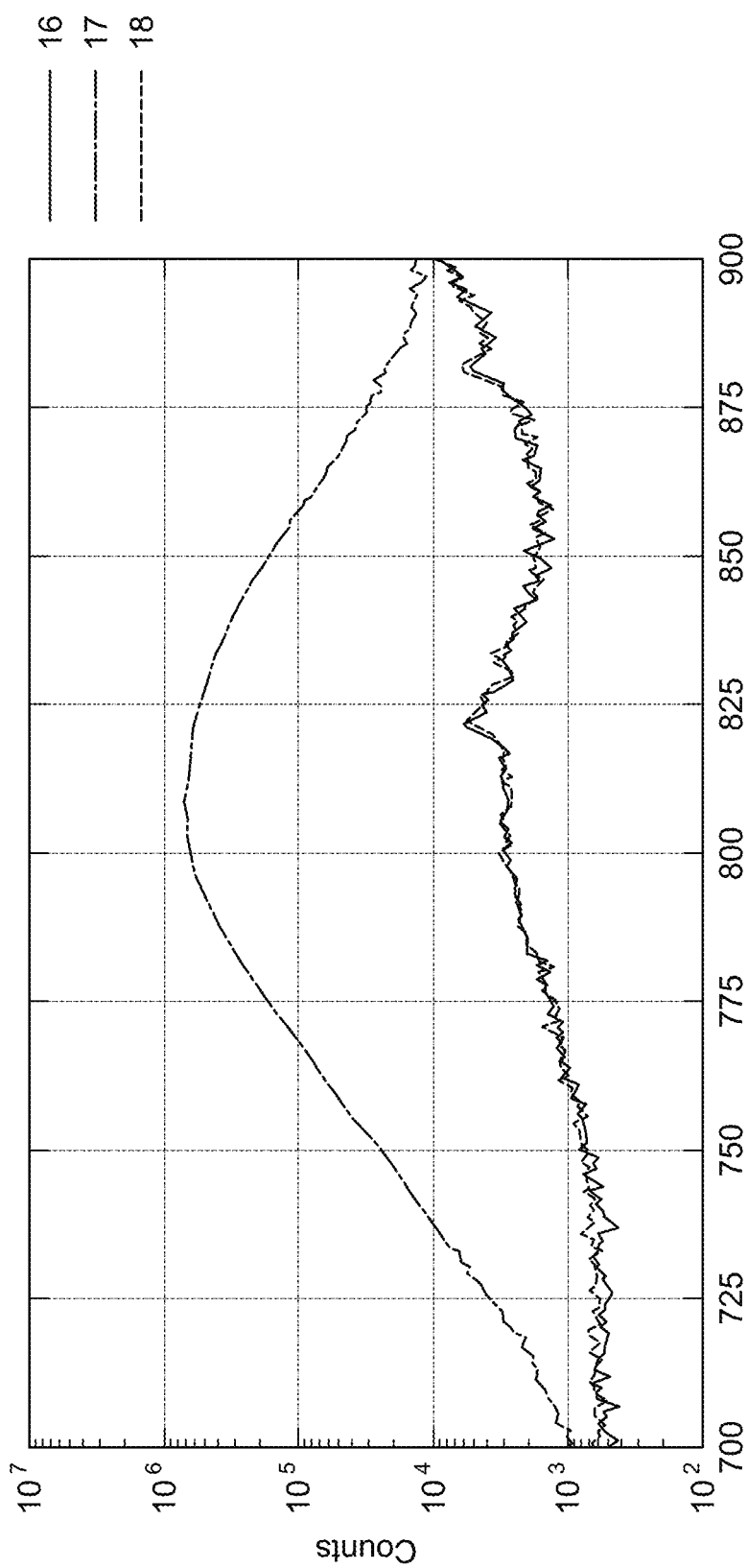
FIG. 13 is a photoluminescence diagram of perovskite on NiO layers according to some embodiments of the present disclosure.
Figure 14:
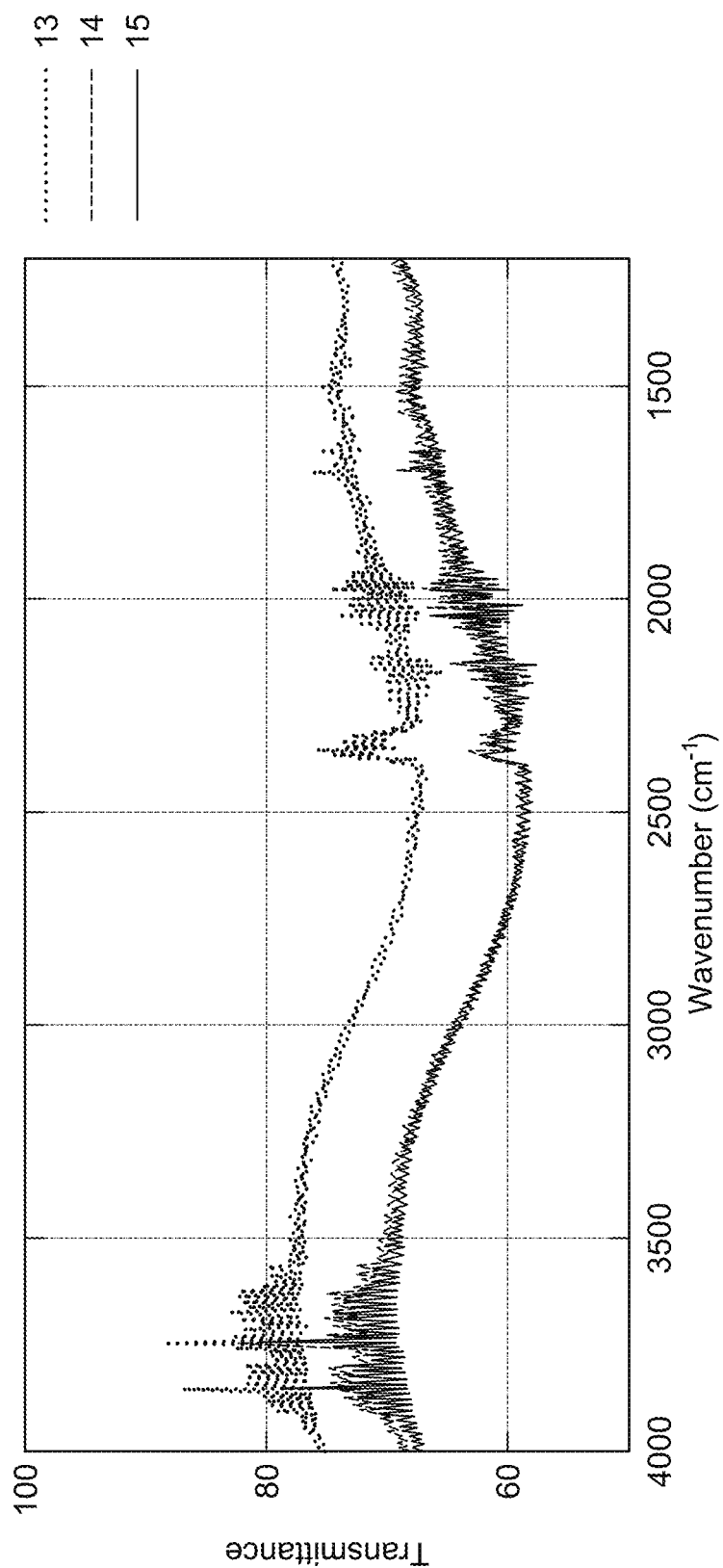
FIG. 14 is Fourier-transform infrared spectroscopy of NiO layers according to some embodiments of the present disclosure.
Figure 15:
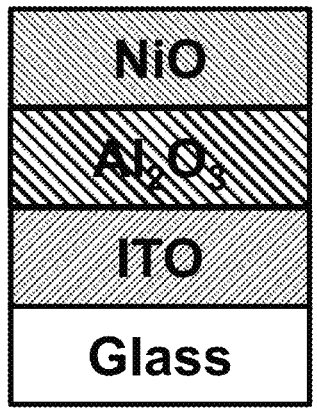
FIG. 15 is an example film stack including NiO layer according to some embodiments of the present disclosure.
Figure 16:
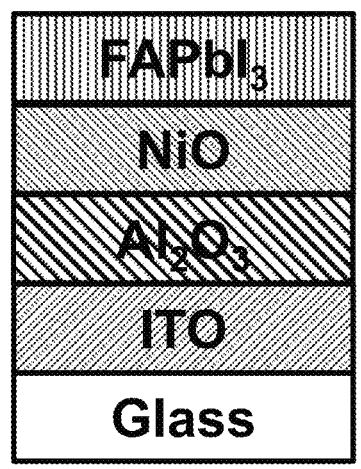
FIG. 16 is another example film stack including NiO layer according to some embodiments of the present disclosure.

FIGS. 12 to 14 illustrate a UV-Vis absorptance diagram, a photoluminescence (PL) diagram and a Fourier-transform infrared spectroscopy (FTIR) diagram, respectively, of various NiO layers produced by the methods and compositions disclosed herein in photovoltaic devices, in accordance with certain embodiments. These various layers are referred to as sample numbers 13 to 18, and the composition of each NiO layer for each sample is described in greater detail below. Sample numbers 16, 17, and 18 further include a 350 nm layer of FAPbI$_3$. FIG. 15 illustrates a stylized diagram of an example thin film stack for sample numbers 13 to 15, in accordance with certain embodiments. FIG. 16 illustrates a stylized diagram of an example film stack for sample numbers 16 to 18, in accordance with certain embodiments. In some embodiments, the thin film stack with the NiO layer shown in FIG. 15 may comprise a substrate, an interfacial layer, and an NiO layer prepared and deposited by the methods described herein. In some embodiments, the thin film stack with the NiO layer shown in FIG. 16 may comprise a substrate, an interfacial layer, and an NiO layer prepared and deposited by the methods described herein, and a layer of perovskite material. The substrate may be an ITO-coated glass. The interfacial layer may be an Al$_2$O$_3$ layer. The perovskite material may be FAPbI$_3$.

The formulation of the NiO precursor ink used to produce the NiO layer in sample number in sample numbers 13-17 included 0.72 M nickel nitrate hexahydrate and 0.1-110 mM nickel acetate tetrahydrate in a mixed solvent of ethylene glycol, ethanolamine, and water having a volume ratio of 12:1.46:1, with additional copper acetate added to obtain the final copper and acetate concentrations as described below for each sample. The formulation of the NiO precursor ink used to produce the NiO layer in sample number 13 includes 5 mol % Cu and 5 mol % acetate. The formulation of the NiO precursor ink used to produce the NiO layer in sample number 14 includes 0 mol % Cu and 12.5 mol % acetate. The formulation of the NiO precursor ink used to produce the NiO layer in sample number 15 includes 5 mol % Cu and 12.5 mol % acetate. The formulation of the NiO precursor ink used to produce the NiO layer in sample number 16 includes 5 mol % Cu and 5 mol % acetate. The formulation of the NiO precursor ink used to produce the NiO layer in sample number 17 includes 0 mol % Cu and 12.5 mol % acetate. The formulation of the NiO precursor ink used to produce the NiO layer in sample number 18 includes 5 mol % Cu and 12.5 mol % acetate. In each of the above described samples, the mole percentage of Cu is shown relative to the total combined moles of Cu and Ni. The mole percentage of acetate is shown relative to the total combined moles of acetate and nickel.

Some or all of materials in accordance with some embodiments of the present disclosure may also advantageously be used in any organic or other optical, mechanical, or electronic device, with some examples including, but not limited to: batteries, field-effect transistors (FETs), light-emitting diodes (LEDs), non-linear optical devices, memristors, capacitors, rectifiers, and/or rectifying antennas.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, and set forth every range encompassed within the broader range of values. Also, the terms in the claims have their plain, ordinary meaning unless otherwise explicitly and clearly defined by the patentee.

What is claimed is:

1. A method for forming a nickel oxide layer on a substrate, comprising:
depositing a nickel oxide precursor ink on a substrate, wherein the nickel oxide precursor ink comprises:
a solvent comprising diols, alcohol amines, and water; $Ni(NO_3)_2 \cdot 6H_2O$; and
at least one metal acetate selected from the group consisting of $Ni(CH_3CO_2)_2 \cdot 4H_2O$ and $Cu(CH_3CO_2)_2 \cdot 1H_2O$;
annealing the nickel oxide precursor ink at a temperature between 250° to 400° Celsius for between 10 minutes and 6 hours to form a nickel oxide layer; and
cooling the nickel oxide layer.

2. The method of claim 1, wherein: the solvent comprises ethylene glycol, ethanolamine and water.

3. The method of claim 1, wherein the substrate is selected from the group consisting of glass, p-doped silicon, n-doped silicon, sapphire, magnesium oxide, mica, polymers, ceramics, fabrics, wood, drywall, metal, ITO-coated glass, FTO-coated glass, or combinations thereof.

4. The method of claim 1, wherein the substrate is coated with a conductive material selected from the group consisting of group consisting of indium-doped tin oxide (ITO), fluorine-doped tin oxide (FTO), cadmium oxide (CdO), zinc indium tin oxide (ZITO), aluminum zinc oxide (AZO), aluminum (Al), gold (Au), calcium (Ca), magnesium (Mg), titanium (Ti), steel, chromium (Cr), copper (Cu), silver (Ag), nickel (Ni), tungsten (W), molybdenum (Mo), carbon, and combinations thereof.

5. The method of claim 1, wherein the nickel oxide precursor ink is deposited on the substrate under an environment having a humidity between 10% and 50% and a temperature between 20° and 60° Celsius.

6. The method of claim 1, wherein the annealing takes place at a temperature of 310° Celsius for a time period of two hours.

* * * * *